United States Patent
Imai

(10) Patent No.: US 8,319,214 B2
(45) Date of Patent: *Nov. 27, 2012

(54) THIN FILM FIELD EFFECT TRANSISTOR WITH AMORPHOUS OXIDE ACTIVE LAYER AND DISPLAY USING THE SAME

(75) Inventor: Shinji Imai, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 5 days.

This patent is subject to a terminal disclaimer.

(21) Appl. No.: 12/292,070

(22) Filed: Nov. 12, 2008

(65) Prior Publication Data

US 2009/0127551 A1    May 21, 2009

(30) Foreign Application Priority Data

Nov. 15, 2007    (JP) .................................. 2007-296392

(51) Int. Cl.
*H01L 29/12*    (2006.01)
(52) U.S. Cl. .......................................... 257/43; 257/49
(58) Field of Classification Search ............... 257/43, 257/59, 49
See application file for complete search history.

(56) References Cited

U.S. PATENT DOCUMENTS

| | | | |
|---|---|---|---|
| 7,297,977 B2 * | 11/2007 | Hoffman et al. ............... | 257/43 |
| 7,402,506 B2 * | 7/2008 | Levy et al. ..................... | 438/584 |
| 7,982,216 B2 * | 7/2011 | Imai ............................... | 257/43 |
| 2006/0108636 A1 | 5/2006 | Sano et al. | |
| 2006/0163674 A1 | 7/2006 | Cho | |
| 2006/0286737 A1 | 12/2006 | Levy et al. | |
| 2007/0194379 A1 | 8/2007 | Hosono et al. | |
| 2009/0127550 A1 * | 5/2009 | Imai ............................... | 257/43 |

FOREIGN PATENT DOCUMENTS

| | | |
|---|---|---|
| EP | 1950177 A | 7/2008 |
| JP | 2006165529 | 6/2006 |
| JP | 2006186319 | 7/2006 |

OTHER PUBLICATIONS

Sze, S.M., Physics of Semiconductor Devices, 1981, John Wiley & Sons, second edition, Appendix H, p. 850-1.*
Barquinha P et al: "Influence of the semiconductor thickness on the electrical properties of transparent TFTs based on indium zinc oxide" Journal of Non-Crystalline Solids, North-Holland Physics Publishing. Amsterdam, NL, vol. 352, No. 9-20, Jun. 15, 2006, pp. 1749-1752, XP025187660 ISSN: 0022-3093.
Office Action dated Mar. 18, 2010 issued against U.S. Appl. No. 12/292,069.
EPO extended European Search Report dated Jun. 3, 2009 issued against EP application No. 08019922.7 corresponding to U.S. Appl. No. 12/292,069.
Joseph et al. (Jpn. J. Appl. Phys. vol. 38 (1999), pp. L1205-L1207.).
The extended European search report dated Jun. 3, 2009.

* cited by examiner

*Primary Examiner* — Howard Weiss
(74) *Attorney, Agent, or Firm* — SOLARIS Intellectual Property Group, PLLC

(57) ABSTRACT

A TFT is provided which includes on a substrate, at least a gate electrode, a gate insulating layer, an active layer containing an amorphous oxide semiconductor, a source electrode, and a drain electrode, wherein a mean square interface roughness between the gate insulating layer and the active layer is less than 2 nm, a carrier concentration of the active layer is $1 \times 10^{15}$ cm$^{-3}$ or more, and a film thickness of the active layer is 0.5 nm or more and less than 20 nm. A TFT is provided which has high field effect mobility and a high ON-OFF ratio, and is improved in environmental temperature dependency. Also, a display using the TFT is provided.

15 Claims, 3 Drawing Sheets

THIN FILM FIELD EFFECT TRANSISTOR WITH AMORPHOUS OXIDE ACTIVE LAYER AND DISPLAY USING THE SAME

CROSS-REFERENCE TO RELATED APPLICATION

This application claims priority under 35 USC 119 from Japanese Patent Application No. 2007-296392, the disclosure of which is incorporated by reference herein.

BACKGROUND OF THE INVENTION

1. Field of the Invention

The present invention relates to a thin film field effect transistor and a display using the same. Particularly, it relates to a thin film field effect transistor in which an amorphous oxide semiconductor is used for an active layer, and a display using the same.

2. Description of the Related Art

In recent years, flat panel displays (FPDs) have been put to practical use, due to the progress made in liquid crystal and electroluminescence (EL) technologies, etc. Especially, an organic electroluminescence element (hereinafter referred to as an "organic EL element" in some cases) formed using a thin film material which emits light by excitation due to application of electric current can provide light emission of high brightness at low voltage, and thus is expected to achieve reduction in device thickness, weight, and size, and power saving, etc. in wide ranging applications including mobile phone displays, personal digital assistants (PDA), computer displays, car information displays, TV monitors, and general illumination.

These FPDs are driven by an active matrix circuit including thin film field effect transistors each using, as an active layer, an amorphous silicon thin film or a polycrystalline silicon thin film provided on a glass substrate. (In the description below, the thin film field effect transistor is sometimes referred to as a "thin film transistor" or "TFT".)

On the other hand, to make the FPD thinner, lighter, and more resistant to breakage, attempts are being made to use a resin substrate which is light in weight and flexible instead of the glass substrate.

However, fabrication of the transistors using the silicon thin films described above requires a thermal treatment process at a relatively high temperature, and it is difficult to form the transistors directly on a resin substrate which is generally low in heat resistance.

For example, in Japanese Patent Application Laid-Open (JP-A) No. 2006-121029, a MOSFET (Metal-Oxide Semiconductor Field Effect Transistor) that reduces a drive voltage of a transistor that uses a silicon thin film is disclosed, and a configuration that uses indium tin oxide (ITO), tin oxide or zinc oxide as a semiconductor material of an active layer and uses a dielectric material having a large dielectric constant in a gate insulating layer is disclosed. It is disclosed that ITO, tin oxide or zinc oxide is a crystalline metal oxide and has a carrier concentration of substantially $1\times10^{19}$ cm$^{-3}$. In the case of an active layer made of the crystalline metal oxide, in order to obtain desired semiconductor characteristics, after film formation by sputtering, a high temperature heat treatment step such as post-annealing at 300° C. for 15 min is necessary in order to control the crystallization (see, for example, paragraph No. [0054] of JP-A No. 2006-121029). Accordingly, such an active layer is difficult to form directly on a resin substrate that is poor in heat resistance.

An amorphous oxide such as an In—Ga—Zn—O-based amorphous oxide can form a film at low temperatures, and, accordingly, has been attracting attention as a material capable of forming a film at room temperature on a plastic film (see, for example, *NATURE*, vol. 432, pages 488-492, Nov. 25, 2004). However, when an amorphous oxide semiconductor is used in an active layer of a TFT, an OFF current is high, and accordingly, there is a problem in that an ON/OFF ratio is low. For example, *APPLIED PHYSICS LETTERS*, 89, 062103 (2006) discloses a configuration of a TFT that uses IZO (In—Zn—O) having a carrier concentration of $2.1\times10^{17}$ cm$^{-3}$ in an active layer as an amorphous oxide semiconductor. However, since the OFF current is still high, a "normally-on" state is caused, in which a current flows even in a state where a TFT gate voltage is not applied. Accordingly, there is a problem in that an extraneous circuit for an ON/OFF operation is necessary and power consumption increases.

As means for solving the problem, JP-A Nos. 2006-165529 and 2006-186319 disclose that, when the carrier concentration of an amorphous oxide semiconductor is reduced to, for example, less than $10^{18}$ cm$^{-3}$, a TFT operates, that when the carrier concentration is less than $10^{16}$ cm$^{-3}$, a TFT having excellent ON/OFF ratio is obtained, and that, in order to impart more excellent low off current characteristics, the carrier concentration is preferably reduced to less than $10^{16}$ cm$^{-3}$.

However, in TFTs supplied for practical use, in addition to low OFF current and high ON/OFF ratio, it is required that the characteristics do not vary even under continuous driving and stable performance is exhibited even when conditions such as a temperature or humidity in an operating environment vary. That is, there still remain many problems to be overcome.

SUMMARY OF THE INVENTION

The present invention has been made in view of the above circumstances and provides a thin film field effect transistor and a display using the same with the following aspects.

A first aspect of the invention provides a thin film field effect transistor, comprising, on a substrate, at least a gate electrode, a gate insulating layer, an active layer containing an amorphous oxide semiconductor, a source electrode, and a drain electrode, wherein a mean square interface roughness between the gate insulating layer and the active layer is less than 2 nm, a carrier concentration of the active layer is $1\times10^{15}$ cm$^{-3}$ or more, and a film thickness of the active layer is 0.5 nm or more and less than 20 nm.

A second aspect of the invention provides a display using the thin film field effect transistor according to the first aspect.

DETAILED DESCRIPTION OF THE INVENTION

Figure 1:
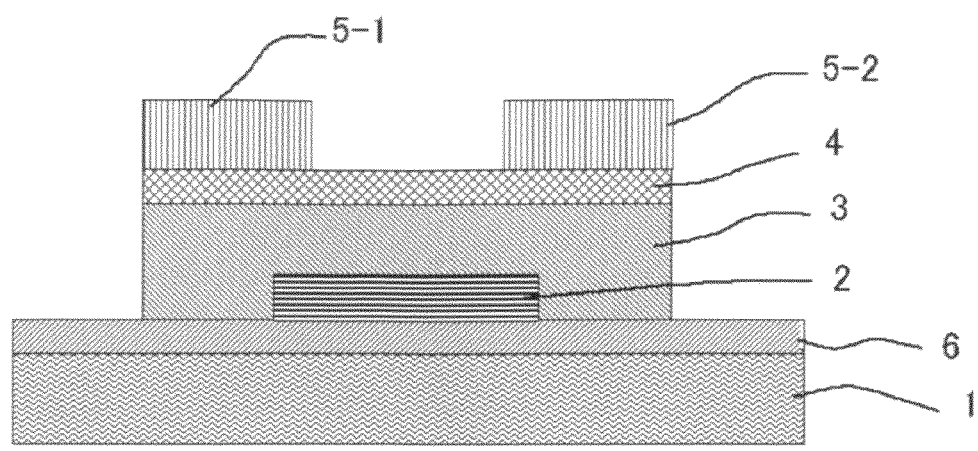
FIG. 1 is a schematic diagram showing the structure of a TFT element having a reversed stagger structure according to the invention.

It is an object of the invention to provide a TFT using an amorphous oxide semiconductor, and particularly, to provide an improved TFT which has a low OFF current and a high ON-OFF ratio, and does not vary in TFT performance even with a variation in environmental temperature. Furthermore, it is an object of the invention to provide a high-performance TFT which can be prepared on a flexible resin substrate. Also, it is another object of the invention to provide a display using the TFT.

A thin film field effect transistor of the invention is characterized in that it includes at least a gate electrode, a gate insulating layer, an active layer containing an amorphous oxide semiconductor, a source electrode, and a drain electrode on a substrate, wherein a mean square interface roughness between the gate insulating layer and the active layer is less than 2 nm, a carrier concentration of the active layer is $1 \times 10^{15}$ cm$^{-3}$ or more, and a film thickness of the active layer is 0.5 nm or more and less than 20 nm.

Preferably, the mean square interface roughness between the gate insulating layer and the active layer is less than 1 nm, and the film thickness of the active layer is 0.5 nm or more and less than 10 nm.

Preferably, the mean square interface roughness between the gate insulating layer and the active layer is less than 0.5 nm, and the film thickness of the active layer is 0.5 nm or more and less than 5 nm.

Preferably, the amorphous oxide semiconductor in the active layer contains at least one selected from the group consisting of In, Ga, Zn and Sn. More preferably, the amorphous oxide semiconductor in the active layer contains In and Zn.

Preferably, the thin film field effect transistor further has a low carrier concentration layer that is in contact with the active layer on the opposite side of the active layer from the gate insulating layer, and has a carrier concentration of $10^{16}$ cm$^{-3}$ or less, which is lower than the carrier concentration of the active layer.

Preferably, the low carrier concentration layer comprises an amorphous oxide semiconductor.

Preferably, the amorphous oxide semiconductor in the low carrier concentration layer contains at least one selected from the group consisting of In, Ga, Zn and Sn. More preferably, the amorphous oxide semiconductor in the low carrier concentration layer contains In and Zn.

Preferably, the gate insulating layer contains an amorphous oxide containing at least one element selected from the group consisting of Si, Hf, Y and Ge.

Preferably, the substrate is a flexible resin substrate.

A TFT using an amorphous oxide semiconductor has been attracting attention as a material for an active layer of a film (flexible) TFT, because an amorphous oxide semiconductor film can be formed at room temperature, which allows a TFT to be prepared using a flexible plastic film as a substrate. Particularly, as disclosed in JP-A Nos. 2006-165529 and 2006-186319, it is reported that a TFT which is formed on a PET film and has good performance such as a field effect mobility of 10 cm$^2$/Vs and an ON-OFF ratio of over $10^3$ was achieved by using an amorphous oxide semiconductor having a carrier concentration of less than $10^{18}$ cm$^{-3}$ in an active layer.

However, when such a TFT is used in a drive circuit of a display, the performance of the TFT is still insufficient with regard to mobility and ON-OFF ratio to operate the drive circuit. An amorphous oxide semiconductor used for the active layer tends to have low electron mobility when the carrier concentration is decreased, so that it has been difficult to form a TFT which can achieve both of good OFF characteristics and high mobility at the same time.

Furthermore, as a result of detailed analysis by the present inventors, new problems have been found such that, when the carrier concentration is reduced to less than $10^{18}$ cm$^{-3}$, in the case where a temperature of an operation environment of the TFT varies, the OFF current value varies, and a threshold voltage of the TFT varies. The lower the carrier concentration is, the larger the variation of the OFF current value and the variation of the threshold voltage of the TFT are. It has been found that, in particular, when the carrier concentration is reduced to less than $3 \times 10^{17}$ cm$^{-3}$, a practically detrimental variation is caused. It has been found that the variation of the OFF current value and the variation of the threshold voltage of the TFT are generated also when the TFT is continuously and repeatedly driven. Conventionally, when such a problem is caused in a semiconductor element, it has been common to introduce, as a counter measure, a temperature compensation circuit unit. However, there are adverse effects such that the circuit becomes complicated and an element volume becomes larger to result in a decrease in aperture ratio. Accordingly, this problem is an important problem to be solved; that is, in addition to attaining both of the OFF current characteristics and high mobility, improvement in environmental temperature dependency and durability is demanded.

The inventors, after earnestly conducting development and research, have found that, when a mean square interface roughness between the gate insulating layer and the active layer is less than 2 nm, a carrier concentration of the active layer is $1 \times 10^{15}$ cm$^{-3}$ or more, and a film thickness of the active layer is 0.5 nm or more and less than 20 nm, utterly unexpectedly, the problem is overcome. Furthermore, it has been found that when the mean square interface roughness between the gate insulating layer and the active layer is less than 1 nm, the carrier concentration of the active layer is $1 \times 10^{17}$ cm$^{-3}$ or more, and the film thickness of the active layer is 0.5 nm or more and less than 10 nm, the environmental temperature dependency is further improved. Particularly, it has been found that it is more preferable to set the mean square interface roughness between the gate insulating layer and the active layer at less than 0.5 nm, the carrier concentration of the active layer at $1 \times 10^{19}$ cm$^{-3}$ or more, and the film thickness of the active layer at 0.5 nm or more and less than 5 nm, and that the variation of the OFF current and the variation of the threshold voltage of the TFT when the TFT is continuously driven for a long time are improved.

According to the present invention, a TFT is provided which has a high ON current, a low OFF current and a high ON-OFF ratio, and is excellent in temperature dependency and stability for continuous driving. Particularly, a TFT which is useful as a film (flexible) TFT using a flexible substrate is provided. Also, a display using the TFT is provided.

1. Thin Film Field Effect Transistor (TFT)

The thin film field effect transistor of the invention is an active element which has at least a gate electrode, a gate insulating layer, an active layer, a source electrode and a drain electrode in this order, and has a function of switching current between the source electrode and the drain electrode, in which a current passing through the active layer is controlled by applying voltage to the gate electrode. As the TFT structure, either of a stagger structure and a reversed stagger structure may be formed.

In the present invention, a mean square interface roughness between the gate insulating layer and the active layer is less than 2 nm, a carrier concentration of the active layer is $1 \times 10^{15}$ cm$^{-3}$ or more, and a film thickness of the active layer is 0.5 nm or more and less than 20 nm. Preferably, the mean square interface roughness between the gate insulating layer and the active layer is less than 1 nm, the carrier concentration of the active layer is $1\times10^{17}$ cm$^{-3}$ or more, and the film thickness of the active layer is 0.5 nm or more and less than 10 nm. Particularly preferably, the mean square interface roughness between the gate insulating layer and the active layer is less than 0.5 nm, the carrier concentration of the active layer is $1\times10^{19}$ cm$^{-3}$ or more, and the film thickness of the active layer is 0.5 nm or more and less than 5 nm.

Preferably, an amorphous oxide semiconductor of the active layer contains at least one selected from the group consisting of In, Ga, Zn and Sn. More preferably, the amorphous oxide semiconductor of the active layer contains In and Zn.

A more preferable embodiment of the active layer in the invention is a configuration where a low carrier concentration layer that has a carrier concentration of $10^{16}$ cm$^{-3}$ or less, which is lower than the carrier concentration of the active layer, is laminated in contact with the active layer on the opposite side of the active layer from the gate insulating layer.

It is preferred that the low carrier concentration layer as well is an amorphous oxide semiconductor layer. It is preferred that the amorphous oxide semiconductor of the low carrier concentration layer contains at least one selected from the group consisting of In, Ga, Zn and Sn. More preferably, the amorphous oxide semiconductor of the low carrier concentration layer contains In and Zn.

As described above, the low carrier concentration layer according to the invention is a material system that is approximate to the active layer, so the active layer is hardly damaged at the time of film formation by sputtering. In the case where film formation is conducted by sputtering using conventional SiO$_2$ as a protective layer, the active layer is easily damaged.

Further, because the low carrier concentration layer according to the invention has a carrier concentration that is an order of magnitude lower than the carrier concentration of the active layer and has high insulating property, the high carrier concentration of the active layer can be stably maintained, and therefore, the effects of the active layer can be stably maintained without being hindered.

Furthermore, the low carrier concentration layer according to the invention also functions as a protective layer that protects the active layer from environment (moisture, oxygen). As the low carrier concentration layer can be made thick as compared with the active layer and is an oxide film, it suppresses diffusion of moisture or oxygen to the active layer and can prevent a change in carrier concentration of the active layer during storage.

Preferably, the gate insulating layer contains an amorphous oxide containing at least one element selected from the group consisting of Si, Hf, Y and Ge.

It is preferred that the substrate is a flexible resin substrate.

The TFT of the invention will be described in detail.

1) Active Layer

For the active layer to the invention, it is preferable to use an amorphous oxide semiconductor. As an amorphous oxide semiconductor film can be formed at a low temperature, it can be prepared on a flexible resin substrate made of plastic. Examples of the amorphous oxide semiconductor which can be prepared at a low temperature include an oxide containing In, an oxide containing In and Zn, and an oxide containing In, Ga and Zn. Considering the compositional structure, it is known that amorphous oxide semiconductors of InGaO$_3$(ZnO)$_m$ (m is a natural number less than 6) are preferable. These amorphous oxide semiconductors are n-type semiconductors, in which electrons serve as carriers. Of course, p-type oxide semiconductors such as ZnO/Rh$_2$O$_3$, CuGaO$_2$, and SrCu$_2$O$_2$ may be used for the active layer. Oxide semiconductors disclosed in JP-A No. 2006-165529 can also be used.

In the present invention, an amorphous oxide semiconductor containing at least one selected from the group consisting of In, Ga, Zn and Sn is preferred. An amorphous oxide semiconductor containing In and Zn is more preferred.

Specifically, the amorphous oxide semiconductor in the invention has a constitution including In—Ga—Zn—O, and preferably a composition of InGaO$_3$(ZnO)$_m$ (m is a natural number less than 6) in a crystalline state. Particularly, InGaZnO$_4$ is preferable. An amorphous oxide semiconductor of such composition has a feature that electron mobility tends to increase with an increase in electric conductivity. In addition, the electric conductivity can be controlled by controlling the partial pressure of oxygen during film formation. As a material for the active layer, not only oxide semiconductors, but also inorganic semiconductors such as Si and Ge, compound semiconductors such as GaAs, and organic semiconductor materials such as pentacene and polythiophene, carbon nanotube, or the like can be applied.

<Carrier Concentration>

A carrier concentration of the active layer in the invention is controlled to a desired value by several means.

As the means for adjusting the carrier concentration of the active layer, the following means are described.

(1) Adjustment by Oxygen Defect

It is known that when an oxygen vacancy is made in an oxide semiconductor, a carrier concentration of an active layer is increased, which results in an increase in electric conductivity. Hence, the carrier concentration of an oxide semiconductor can be controlled by adjusting the quantity of oxygen vacancies. Specifically, methods for controlling the quantity of oxygen vacancies include adjusting the partial pressure of oxygen during film formation, and oxygen concentration and treatment time of an after-treatment after the film formation. Specifically, examples of the after-treatment include heat treatment at a temperature of 100° C. or higher, processing by oxygen plasma, and UV ozone treatment. Among these, the method involving controlling the partial pressure of oxygen during film formation is preferable in view of its productivity. The carrier concentration of an oxide semiconductor can be controlled by adjusting the partial pressure of oxygen during film formation.

(2) Adjustment by Composition Ratio

It has been known that the carrier concentration can be changed by changing the composition ratio of metals of an oxide semiconductor. For instance, in the case of InGaZn$_{1-x}$Mg$_x$O$_4$, the carrier concentration lowers with an increase in the percentage of Mg. In addition, it has been reported that the carrier concentration of oxides of (In$_2$O$_3$)$_{1-x}$(ZnO)$_x$ lowers with an increase in the percentage of Zn when the Zn/In ratio is 10% or higher. Specifically, methods for changing the composition ratio for example in the case of a method of forming a film by sputtering include a method using targets with different composition ratios. Alternatively, multiple targets may be co-sputtered, changing the composition ratio of the resultant film by individually adjusting the sputtering rates for the targets.

(3) Adjustment by Impurities

When elements such as La, Na, Mn, Ni, Pd, Cu, Cd, C, N, and P are selectively added to an oxide semiconductor as an impurity, the carrier concentration can be reduced. Methods for adding an impurity include co-vapor deposition of the oxide semiconductor and the impurity, and ion-doping of an oxide semiconductor film which has already been formed with ions of the impurity element.

(4) Adjustment by Oxide Semiconductor Material

While in the above (1) to (3), the methods of adjusting the carrier concentration of the same oxide semiconductor system have been described, the carrier concentration can be changed by changing the oxide semiconductor material. It is known that the carrier concentration of $SnO_2$-based oxide semiconductors is lower than the carrier concentration of $In_2O_3$-based oxide semiconductors. In this way, the carrier concentration can be adjusted by changing the oxide semiconductor material.

As the means for adjusting the carrier concentration, the methods stated in the above (1) to (4) may be used independently or in combination.

<Method of Forming Active Layer>

As the methods for forming a film of the active layer, it is suitable to adopt a vapor-phase film forming method using, as a target, a polycrystalline sintered body of an oxide semiconductor. Among the vapor-phase film forming methods, sputtering method and pulsed laser deposition method (PLD method) are adequate. For mass production, sputtering method is preferable.

For instance, by an RF magnetron sputtering deposition method, a film can be formed while controlling the vacuum level and flow rate of oxygen. The higher the flow rate of oxygen is, the lower the electric conductivity can be made.

The active layer in the invention is a very thin layer. In order to exert excellent TFT performance with such a thin layer region, the uniformity of an interface between the active layer and an adjacent layer to which the active layer is disposed is important. For example, in the case of a bottom-gate TFT, usually an active layer is disposed on a gate insulating layer. In this case, it is necessary that an interface between the gate insulating layer and the active layer should be smooth. Specifically, concerning the smoothness, a mean square interface roughness is less than 2 nm, preferably less than 1 nm, and more preferably less than 0.5 nm. In order to achieve this, film-formation speeds of the gate insulating layer and the active layer are preferably controlled by the sputtering speed and deposition speed of the respective film components to find a condition for forming a uniform film to carry out.

It can be verified by conventional X-ray diffraction that the resultant film is an amorphous film. The composition ratio can be determined by RBS analysis (Rutherford Backscattering Spectrometry).

<Thickness of Active Layer>

The active layer in the present invention is very thin, and the thickness of the active layer is 0.5 nm or more and less than 20 nm. It is preferably 0.5 nm or more and less than 10 nm, and more preferably 0.5 nm or more and less than 5 nm.

The thickness of the active layer can be determined by HRTEM (High Resolution Transmittance Electron Micrograph) photograph of a section of the prepared element.

Use of the active layer arranged as described above achieves a TFT characterized by an ON-OFF ratio of $10^6$ or higher and high mobility of 10 $cm^2/Vs$ or higher.

<Multilayer Structure of Active Layer>

In the invention, a multilayer structure where a low carrier concentration layer that has a carrier concentration of $10^{16}$ $cm^{-3}$ or less is laminated in contact with the active layer on the opposite side of the active layer from the gate insulating layer is preferred.

A semiconductor material used in the low carrier concentration layer as well is preferred to be an amorphous oxide.

The carrier concentration of the low carrier concentration layer is preferably $10^{15}$ $cm^{-3}$ or less, and more preferably $10^{14}$ $cm^{-3}$ or less.

In the case of the embodiment having a top-contact structure (FIG. 3), where a low carrier concentration layer is disposed between an active layer and a source and drain electrode, a ratio of the electric conductivity of the active layer to the electric conductivity of the low carrier concentration layer (electric conductivity of active layer/electric conductivity of low carrier concentration layer) is preferably from $10^1$ to $10^{10}$, and more preferably $10^2$ to $10^8$.

The semiconductor material used in the low carrier concentration layer may be selected from materials described of materials of the active layer to use. The carrier concentration as well may be controlled by similar means described of the control means of a carrier concentration in the active layer.

A thickness of the low carrier concentration layer is not particularly limited, but is approximately in a range of from 0.5 nm to 100 nm, and preferably in a range of from 1 nm to 50 nm.

2) Gate Electrode

According to the invention, the following materials are among those which are preferable for the gate electrode: a metal such as Al, Mo, Cr, Ta, Ti, Au or Ag, an alloy such as Al—Nd or APC; a metal oxide electrically conductive film of e.g., tin oxide, zinc oxide, indium oxide, indium-tin oxide (ITO), or indium-zinc oxide (IZO); an organic electrically conductive compound such as polyaniline, polythiophene, or polypyrrole; or a mixture thereof.

The thickness of the gate electrode is preferably from 10 nm to 1000 nm.

The method of forming the gate electrode is not particularly limited. The gate electrode can be formed on the substrate according to a method which is appropriately selected from among wet methods such as a printing method and a coating method, physical methods such as a vacuum deposition method, a sputtering method and an ion plating method, chemical methods such as a chemical vapor deposition (CVD) and plasma CVD method, and the like in consideration of the suitability to the material described above. For example, when ITO is selected, the gate electrode can be formed according to a direct current or high-frequency sputtering method, a vacuum deposition method, or an ion plating method. Further, in the case where an organic electrically conductive compound is selected as the material of the gate electrode, the film formation of the gate electrode can be performed according to a wet film-forming method.

3) Gate Insulating Layer

For the gate insulating layer, an amorphous oxide containing at least one element selected from the group consisting of Si, Hf, Y and Ge is preferably used. Specifically, an insulator such as $SiO_2$, $SiN_x$, SiON, $Al_2O_3$, $Y_2O_3$, $Ta_2O_5$, $HfO_2$ or the like, or a mixed crystal compound containing at least two of these is used. Also, a polymeric insulator such as polyimide may be used for the gate insulating layer.

It is preferable that the gate insulating layer has a thickness of from 10 nm to 10 μm. To reduce the leak current and raise the voltage resistance, it is required to make the gate insulating layer thicker to a certain extent. However, an increase in the thickness of the gate insulating layer results in a rise in the voltage needed for driving the TFT. Therefore, it is preferable that the thickness of the gate insulating layer is from 50 nm to 1000 nm for an inorganic insulator, and from 0.5 μm to 5 μm for a polymeric insulator. Especially, it is particularly preferable to use an insulator with a high dielectric constant, such as $HfO_2$, for the gate insulating layer, because then the TFT can be driven with low voltage even when it is made thicker.

<<Interface Roughness Between Gate Insulating Layer and Active Layer>>

In the invention, the interface roughness between the gate insulating layer and the active layer is less than 2 nm in terms of mean square roughness, preferably less than 1 nm, and more preferably less than 0.5 nm.

—Measurement Method of Interface Roughness Between Gate Insulating Layer and Active Layer—

In the measurement of the mean square interface roughness between the gate insulating layer and the active layer in the invention, a cross-section of a prepared TFT element is photographed by use of a high resolution transmission electron microscope (HRTEM) and the mean square roughness is calculated from an obtained photograph according to the following procedure.

A region of 1000 nm in a channel region is selected and a boundary line between the gate insulating layer and the active layer is traced at the resolution of 0.1 nm or less to prepare boundary line data. From the obtained boundary line data, low frequency components of 20 nm or less are removed to prepare trend-removed data. A mean square error of the trend-removed data is determined, and this is taken as the mean square interface roughness (Ra) between the gate insulating layer and the active layer.

—Method of Controlling Interface Roughness Between Gate Insulating Layer and Active Layer—

The mean square interface roughness (Ra) between a gate insulating layer and an active layer varies depending on preparing conditions of the gate insulating layer and preparing conditions of the active layer. Furthermore, the mean square interface roughness (Ra) between a gate insulating layer and an active layer is largely affected by the smoothness of a surface of a gate electrode that is a foundation layer of the gate insulating layer and the smoothness of a surface of an insulating substrate that is a foundation layer of the gate electrode. In the case of a flexible substrate in particular, a surface of a plastic film is inferior in the smoothness to that of a glass substrate; accordingly, the film-formation conditions are preferably controlled so that a gate electrode or a gate insulating layer disposed on the flexible substrate may bury the surface irregularity that the plastic film has, and thereby to improve the smoothness.

In preparing a gate insulating layer, in order that a surface of a resulting gate insulating layer may be uniform and form a smooth surface state, a material of the gate insulating layer is selected and a sputtering speed, temperature and deposition speed of film-constituting components are controlled. Furthermore, as to preparing conditions of the active layer as well, in order not to roughen a surface of the gate insulating layer, the film-formation speed of the active layer is preferred to apply after the sputtering speeds or deposition speeds of film constituting components are controlled to find conditions for uniformly forming a film.

From the viewpoint of the smoothness, a glass substrate is preferred, and, among these, a glass prepared according to a melt floating method and a surface-polished glass are excellent in the smoothness. Furthermore, it is preferred to apply a smoothing layer of an acryl resin or the like on a substrate surface.

4) Source Electrode and Drain Electrode

According to the invention, the following are suitable for the material of the source electrode and the drain electrode: metals such as Al, Mo, Cr, Ta, Ti, Au and Ag; alloys such as Al—Nd and APC; metal oxide electrically conductive films of, for example, tin oxide, zinc oxide, indium oxide, indium-tin oxide (ITO) and indium-zinc oxide (IZO); and organic electrically conductive compounds such as polyaniline, polythiophene and polypyrrole, and mixtures thereof.

The thickness of the source electrode and the drain electrode is preferably from 10 nm to 1000 nm.

The method of forming the source electrode and the drain electrode is not particularly limited. The electrodes can be formed on the substrate according to a method which is appropriately selected from among wet methods such as a printing method and a coating method, physical methods such as a vacuum deposition method, a sputtering method and an ion plating method, chemical methods such as a CVD and plasma CVD method, and the like in consideration of the suitability to the material described above. For example, when ITO is selected, the electrodes can be formed according to a DC or high-frequency sputtering method, a vacuum deposition method, an ion plating method, etc. Further, in the case where an organic electrically conductive compound is selected as the material of the source electrode and the drain electrode, the film formation of the source electrode and drain electrode can be performed according to a wet film-forming method.

5) Substrate

According to the invention, the substrate used herein is not particularly limited. The following materials are for example suitable for the substrate: inorganic materials such as YSZ (zirconia stabilized yttrium) and glass; and organic materials including polyesters such as polyethylene terephthalate, polybutylene terephthalate and polyethylene naphthalate, and synthetic resins such as polystyrene, polycarbonate, polyether sulfone, polyarylate, allyl diglycol carbonate, polyimide, polycycloolefin, norbornene resin, and polychlorotrifluoroethylene. In the case of the organic materials described above, a material superior in heat resistance, stability of dimension, resistance to solvents, electric insulating property, workability, low gas permeability, low hygroscopicity, and the like is preferable for the substrate.

According to the invention, it is particularly preferable to use a flexible substrate. As for the material used for the flexible substrate, an organic plastic film which has high transmittance is preferable. For instance, the following materials can be used: polyesters such as polyethylene terephthalate, polybutylene phthalate and polyethylene naphthalate; and plastic films such as polystyrene, polycarbonate, polyether sulfone, polyarylate, polyimide; polycycloolefin, norbornene resin, and polychlorotrifluoroethylene. Also, it is preferable that such film-shaped plastic substrate has an insulating layer in the case where the insulation is insufficient, a gas-barrier layer for preventing moisture and oxygen from penetrating through the substrate, or an undercoat layer for enhancing planarity and adhesion with the electrode or active layer of the film-shaped plastic substrate.

It is preferable that the thickness of the flexible substrate is from 50 μm to 500 μm. The reason for this is that when the thickness of the flexible substrate is less than 50 μm, it is hard for the substrate to maintain sufficient planarity itself, and when the flexible substrate is thicker than 500 μm, it becomes difficult to bend the substrate itself freely, i.e., the flexibility of the substrate becomes insufficient.

6) Structure

Next, the structure of the TFT of the invention will be described in detail with reference to the drawings.

FIG. 1 is a schematic diagram showing an example of the reversed stagger structure of the TFT of the invention. In the case where a substrate 1 is composed of a flexible substrate such as a plastic film or the like, the TFT has an insulating layer 6 disposed on at least one surface of the substrate 1, and on the insulating layer 6, a gate electrode 2, a gate insulating layer 3, and an active layer 4 are stacked. On the surface of the structure thus constructed, a source electrode 5-1 and a drain electrode 5-2 are disposed.

Figure 2:
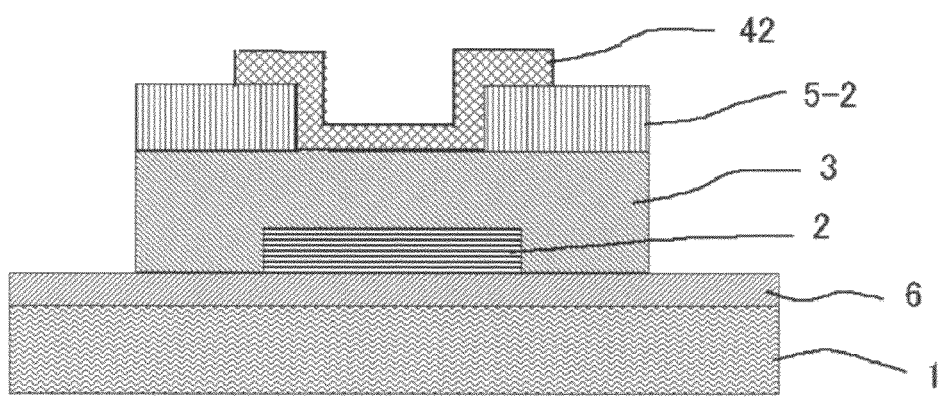
FIG. 2 is a schematic diagram showing the structure of a TFT element according to another embodiment of the invention.

FIG. 2 is a schematic diagram showing an example of the TFT element according to another embodiment of the invention. In the case where a substrate 1 is composed of a flexible substrate such as a plastic film or the like, the TFT has an insulating layer 6 disposed on at least one surface of the substrate 1, and on the insulating layer 6, a gate electrode 2, and a gate insulating layer 3 are stacked. On the surface of the structure thus constructed, a source electrode 5-1 and a drain electrode 5-2 are disposed, and thereon an active layer 42 is disposed.

Figure 3:
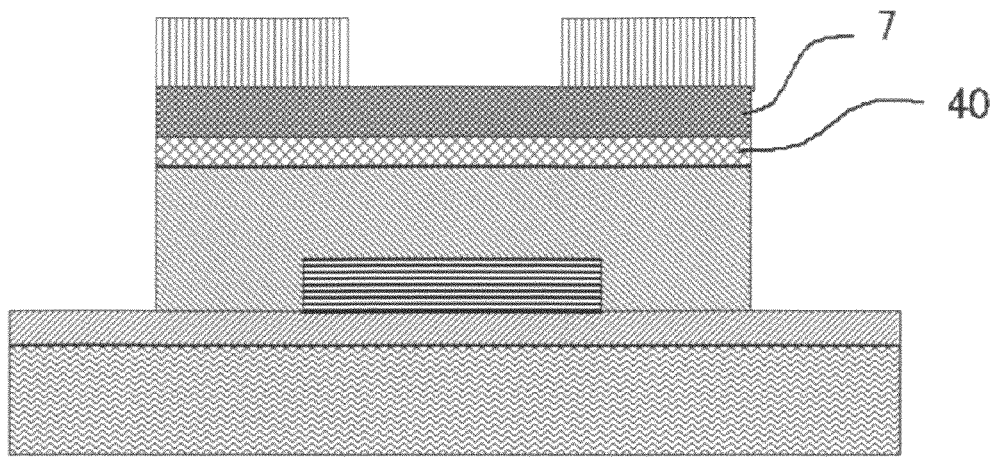
FIG. 3 is a schematic diagram showing the structure of a TFT element according to yet another embodiment of the invention.

FIG. 3 is a schematic diagram showing an example of the structure of the TFT according to yet another embodiment of the invention. In the case where a substrate is composed of a flexible substrate such as a plastic film or the like, the TFT has an insulating layer disposed on at least one surface of the substrate, and on the insulating layer, a gate electrode, a gate insulating layer, an active layer 40, and a low carrier concentration layer 7 are stacked. On the surface of the structure thus constructed, a source electrode 5-1 and a drain electrode 5-2 are disposed. The compositions of the active layer 40 and low carrier concentration layer 7 are determined so that the electric conductivity of the active layer 40 is higher than the electric conductivity of the low carrier concentration layer 7 when no voltage is applied to the gate electrode.

Figure 4:
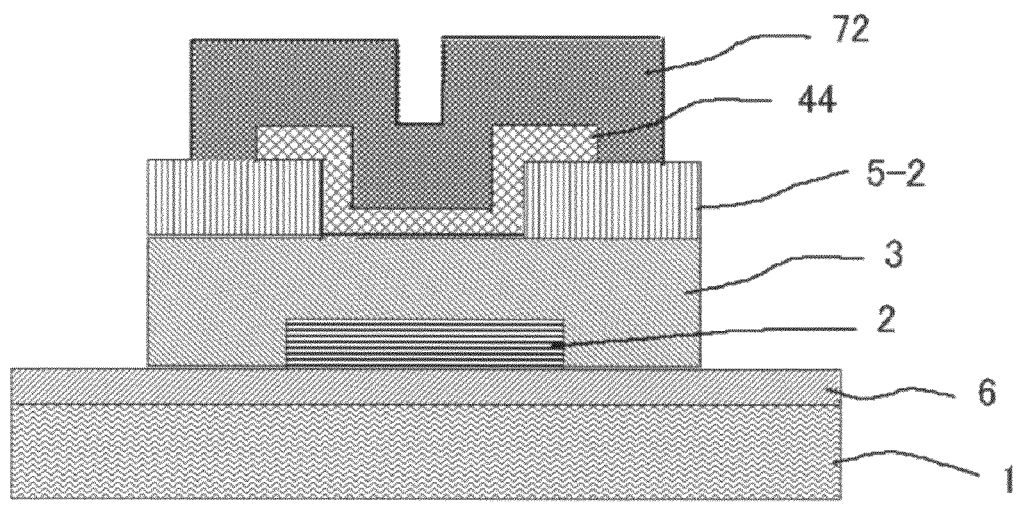
FIG. 4 is a schematic diagram showing the structure of a TFT element according to yet another embodiment of the invention.

FIG. 4 is a schematic diagram showing an example of the structure of the TFT according to yet another embodiment of the invention. In the case where a substrate is composed of a flexible substrate such as a plastic film or the like, the TFT has an insulating layer 6 disposed on at least one surface of the substrate 1, and on the insulating layer, a gate electrode 2, and a gate insulating layer 3 are stacked. On the gate insulating layer 3, a source electrode 5-1 and a drain electrode 5-2 are disposed, and thereon an active layer 44 and a low carrier concentration layer 72 are disposed.

According to the structure shown in FIG. 2 or FIG. 3, a source electrode and a drain electrode are not disposed directly on a thin active layer, and therefore, the active layer does not suffer from damages during a process providing the source electrode and drain electrode.

According to the structure shown in FIG. 4, the active layer 44 is protected from an environmental action (moisture or oxygen), and therefore, in the case where, after the formation of the source electrode and drain electrode, an organic EL element part is disposed thereon, the active layer does not suffer from damages during the process.

Figure 5:
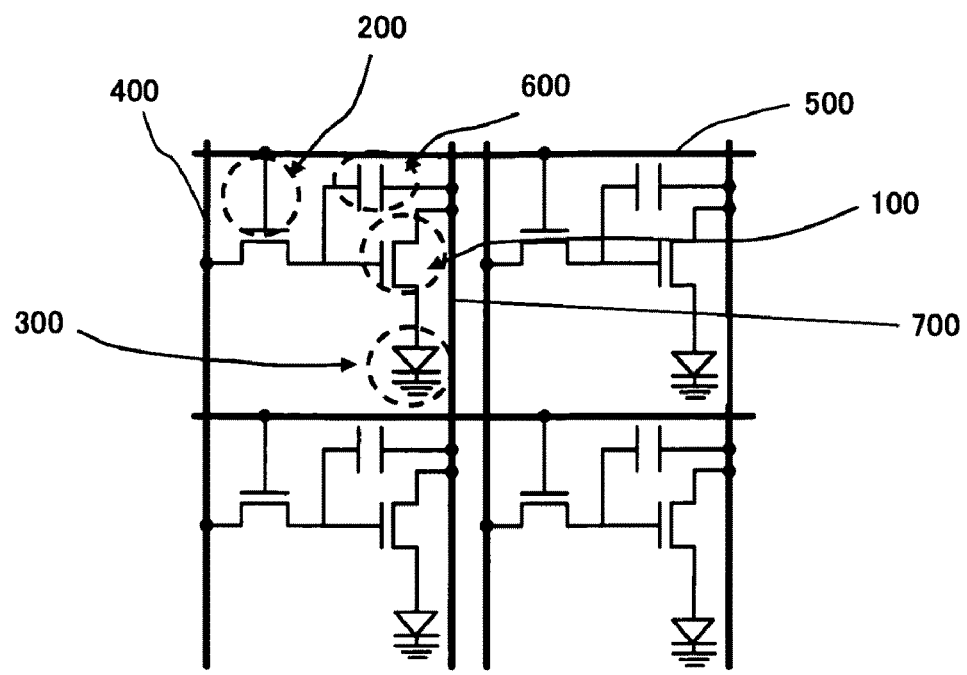
FIG. 5 is a schematic diagram of an equivalent circuit of an active matrix-driving type organic EL display using the TFT element according to the invention.

FIG. 5 is a schematic diagram of an equivalent circuit of an active matrix-driving type organic EL display which uses the TFT element of the invention. The circuit of the organic EL display according to the invention is not particularly limited to that shown in FIG. 5. A circuit which is conventionally known in the art may be applied as-is.

2. Display

The thin film field effect transistor of the invention is preferably used for an image display with a liquid crystal or EL element incorporated therein, and particularly for a flat panel display (FPD). More preferably, it is used for a flexible display in which a flexible substrate such as an organic plastic film is used as its substrate. Particularly, the thin film field effect transistor of the invention has high mobility, and therefore it is most preferably used for a display incorporating an organic EL element, a flexible organic EL display.

(Organic EL Display)

The organic EL display of the invention includes, on a substrate, an organic EL element having at least a lower electrode, an organic layer containing at least a light-emitting layer and an upper electrode, in this order, and a TFT for driving the organic EL element having at least a gate electrode, a gate insulating layer, an active layer containing an oxide semiconductor, a source electrode, and a drain electrode on the upper electrode. Since the TFT is disposed at a back side of the organic EL element, an aperture for extracting light emission of the organic EL element can be made larger. Preferably, a protective insulating layer is disposed between the TFT and the organic EL element, and the upper electrode of the organic EL element and the source electrode or the drain electrode of the TFT are electrically connected by way of a contact hole formed in the protective insulating layer. Preferably, the lower electrode is a light transmitting electrode and the upper electrode is a light reflective electrode.

Hereinafter, the organic EL element according to the invention is described in detail.

The light-emitting element according to the invention has a cathode and an anode on a substrate, and an organic compound layer containing an organic light-emitting layer (hereinafter, sometimes simply referred to as a "light-emitting layer") between the two electrodes. Due to the nature of a light-emitting element, at least one electrode of the anode and the cathode is preferably transparent.

As an integration pattern of the organic compound layer according to the present invention, it is preferred that the layer includes a hole transport layer, a light-emitting layer, and an electron transport layer integrated in this order from the anode side. Moreover, a hole injection layer is provided between the hole transport layer and the anode, and/or an electron transporting intermediate layer is provided between the light-emitting layer and the electron transport layer. In addition, a hole transporting intermediate layer may be provided between the light-emitting layer and the hole transport layer, and similarly, an electron injection layer may be provided between the cathode and the electron transport layer.

Further, each of the layers may be composed of plural secondary layers.

The respective layers constituting the organic compound layer can be suitably formed in accordance with any of a dry film-forming method such as a vapor deposition method, or a sputtering method; a transfer method; a printing method; a coating method; an ink-jet method; a spray method; or the like.

Next, the components constituting the organic EL element according to the present invention will be described in detail.

(Substrate)

The substrate to be applied in the invention is preferably one which does not scatter or attenuate light emitted from the organic compound layer. Specific examples of materials for the substrate include inorganic materials such as zirconia-stabilized yttrium (YSZ), glass and the like; organic materials such as polyesters, for example, polyethylene terephthalate, polybutylene phthalate, and polyethylene naphthalate, polystyrene, polycarbonate, polyethersulfone, polyarylate, polyimide, polycycloolefin, norbornene resin, polychlorotrifluoroethylene, and the like.

For instance, when glass is used as the substrate, non-alkali glass is preferably used with respect to the quality of material in order to decrease ions eluted from the glass. In the case of employing soda-lime glass, it is preferred to use glass on which a barrier coat of silica or the like has been applied. In the case of employing an organic material, it is preferred to use a material excellent in heat resistance, dimensional stability, solvent resistance, electric insulating property, and workability.

There is no particular limitation as to the shape, the structure, the size or the like of the substrate, but it may be suitably selected according to the application, purposes and the like of the light-emitting element. In general, a plate-like substrate is preferred as the shape of the substrate. A structure of the substrate may be a monolayer structure or a laminated structure. Furthermore, the substrate may be formed from a single member or two or more members.

Although the substrate may be transparent and colorless, or transparent and colored, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

(Anode)

The anode may generally be any material as long as it has a function as an electrode for supplying holes to the organic compound layer, and there is no particular limitation as to the shape, the structure, the size or the like. However, it may be suitably selected from among well-known electrode materials according to the application and purpose of the light-emitting element. As mentioned above, the anode is usually provided as a transparent anode.

Materials for the anode preferably include, for example, metals, alloys, metal oxides, electrically conductive compounds, and mixtures thereof. Specific examples of the anode materials include electrically conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electrically conductive metal oxides; inorganic electrically conductive materials such as copper iodide and copper sulfide; organic electrically conductive materials such as polyaniline, polythiophene, and polypyrrole; and laminates of these inorganic or organic electrically conductive materials with ITO. Among these, the electrically conductive metal oxides are preferred, and particularly, ITO is preferable in view of productivity, high electric conductivity, transparency and the like.

The anode may be formed on the substrate in accordance with a method which is appropriately selected from among wet methods such as a printing method, a coating method and the like; physical methods such as a vacuum deposition method, a sputtering method, an ion plating method and the like; and chemical methods such as a CVD and plasma CVD method and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence element according to the present invention, a position at which the anode is to be formed is not particularly limited, and it may be suitably selected according to the application and purpose of the light-emitting element. However, the anode is preferably formed on the substrate. In this case, the anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in a range of from 10 nm to 50 µm, and preferably from 50 nm to 20 µm.

A value of electric resistance of the anode is preferably $10^3$ Ω/□ or less, and more preferably $10^2$ Ω/□ or less. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTEN-KAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film thereof at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the light-emitting element.

Materials constituting the cathode include, for example, metals, alloys, metal oxides, electrically conductive compounds, and mixtures thereof. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron inject-ability.

Among these, as the materials for constituting the cathode, alkaline metals or alkaline earth metals are preferred in view of electron inject-ability, and materials containing aluminum as a major component are preferred in view of excellent preservation stability.

The term "material containing aluminum as a major component" refers to a material constituted by aluminum alone; alloys comprising aluminum and 0.01% by weight to 10% by weight of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, the contents of which are incorporated by reference herein.

A method for forming the cathode is not particularly limited, but it may be formed in accordance with a well-known method. For instance, the cathode may be formed in accordance with a method which is appropriately selected from among wet methods such as a printing method, a coating method and the like; physical methods such as vacuum deposition method, a sputtering method, an ion plating method and the like; and chemical methods such as a CVD and plasma CVD method and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted between the cathode and the organic compound layer with a thickness of from 0.1 nm to 5 nm. The dielectric layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in a range of from 10 nm to 5 μm, and preferably from 50 nm to 1 μm.

Moreover, the cathode may be transparent or opaque. The transparent cathode may be formed by preparing a material for the cathode with a small thickness of 1 nm to 10 nm, and further laminating a transparent electrically conductive material such as ITO or IZO thereon.

(Organic Compound Layer)

The organic compound layer according to the present invention is to be described.

The organic EL element according to the present invention has at least one organic compound layer including a light-emitting layer. An organic compound layer apart from the light-emitting layer comprises a hole transport layer, an electron transport layer, a hole blocking layer, an electron blocking layer, a hole injection layer, an electron injection layer and the like as described above.

In the organic EL element according to the present invention, the respective layers constituting the organic compound layer can be suitably formed in accordance with any of a dry film-forming method such as a vapor deposition method, or a sputtering method; a wet film-forming method; a transfer method; a printing method; an ink-jet method; or the like.

(Light-Emitting Layer)

The organic light-emitting layer is a layer having functions of receiving holes from the anode, the hole injection layer, or the hole transport layer, and receiving electrons from the cathode, the electron injection layer, or the electron transport layer, and providing a field for recombination of the holes with the electrons to emit light, when an electric field is applied to the layer.

The light-emitting layer according to the present invention may contain only a light-emitting material, or may be a mixture layer containing a light-emitting dopant and a host material. The light-emitting dopant may be a fluorescent light-emitting material or a phosphorescent light-emitting material, and may be a plurality of those compounds. Preferably, the host material is a charge-transporting material. The host material may be one or a plurality of compounds. For example, a mixture of a hole-transporting host material and an electron transporting host material is preferable. Further, a material which does not emit light nor transport any charge may be contained in the light-emitting layer.

The light-emitting layer may be a single layer or a plurality of layers, wherein the respective layers may emit light of different color from one another.

In the present invention, any of a fluorescent light-emitting material and a phosphorescent light-emitting material may be used as a light-emitting dopant.

The light-emitting layer according to the present invention may contain two or more types of light-emitting dopants for improving color purity and expanding the wavelength region of emitted light. It is preferred that the light-emitting dopant in the present invention is one satisfying a relationship between the above-described host material and the light-emitting dopant of 1.2 eV>the difference of Ip between host material and light-emitting dopant (ΔIp)>0.2 eV and/or 1.2 eV>the difference of Ea between host material and light-emitting dopant (ΔEa)>0.2 eV in view of drive durability.

<<Phosphorescent Light-Emitting Dopant>>

Examples of the phosphorescent light-emitting dopants generally include complexes containing a transition metal atom or a lanthanoid atom.

For instance, although the transition metal atom is not limited, it is preferably ruthenium, rhodium, palladium, tungsten, rhenium, osmium, iridium, gold, silver, copper or platinum; more preferably rhenium, iridium, or platinum, and even more preferably iridium or platinum.

Examples of the lanthanoid atom include lanthanum, cerium, praseodymium, neodymium, samarium, europium, gadolinium, terbium, dysprosium, holmium, erbium, thulium, ytterbium, and lutetium, and among these lanthanoid atoms, neodymium, europium, and gadolinium are preferred.

Examples of ligands in the complex include the ligands described, for example, in "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "YUHKI KINZOKU KAGAKU—KISO TO OUYOU— (Organometallic Chemistry—Fundamental and Application—)" authored by Akio Yamamoto, published by Shokabo Publishing Co., Ltd. in 1982.

Specific examples of the ligand preferably include halogen ligand (preferably, chlorine ligand), aliphatic carbocyclic ligand (for example, having preferably 5 to 30 carbon atoms, more preferably 6 to 30 carbon atoms, further preferably 6 to 20 carbon atoms, and particularly preferably 6 to 12 carbon atoms, such as cyclopentadienyl anion, benzene anion, naphthyl anion, or the like), nitrogen-containing heterocyclic ligand (for example, having preferably 5 to 30 atoms, more preferably 6 to 30 carbon atoms, further preferably 6 to 20 carbon atoms, and particularly preferably 6 to 12 carbon atoms, for example, phenyl pyridine, benzoquinoline, quinolinol, bipyridyl, phenanthrorine, or the like), diketone ligand (for example, acetyl acetone, or the like), carboxylic acid ligand (for example, having preferably 2 to 30 carbon atoms, more preferably 2 to 20 carbon atoms, and further preferably 2 to 16 carbon atoms, such as acetic acid ligand, or the like), alcoholato ligand (for example, having preferably 1 to 30 carbon atoms, more preferably 1 to 20 carbon atoms, and further preferably 6 to 20 carbon atoms, such as phenolato ligand, or the like), silyloxy ligand (for example, having preferably 3 to 40 carbon atoms, more preferably 3 to 30 carbon atoms, and further preferably 3 to 20 carbon atoms, such as trimethyl silyloxy ligand, dimethyl-tert-butyl silyloxy ligand, triphenyl silyloxy ligand, or the like), carbon monoxide ligand, isonitrile ligand, cyano ligand, phosphorus ligand (having preferably 3 to 40 carbon atoms, more preferably 3 to 30 carbon atoms, further preferably 3 to 20 carbon atoms, and particularly preferably, 6 to 20 carbon atoms, such as triphenyl phosphine ligand, or the like), thiolato ligand (having preferably 1 to 30 carbon atoms, more preferably 1 to 20 carbon atoms, and further preferably 6 to 20 carbon atoms, such as phenyl thiolato ligand, or the like), and phosphine oxide ligand (having preferably 3 to 30 carbon atoms, more preferably 8 to 30 carbon atoms, and further preferably 18 to 30 carbon atoms, for example, triphenyl phosphine oxide ligand, or the like), and more preferably nitrogen-containing heterocyclic ligand.

The above-described complexes may be either a complex containing one transition metal atom in the compound, or a so-called polynuclear complex containing two or more transition metal atoms wherein different metal atoms may be contained at the same time.

Among these, specific examples of the light-emitting dopants include phosphorescent light-emitting compounds described in patent documents such as U.S. Pat. Nos. 6,303,238B1, and 6,097,147; International Patent Publication (WO) Nos. 00/57676, 00/70655, 01/08230, 01/39234A2, 01/41512A1, 02/02714A2, 02/15645A1, 02/44189A1, and 05/19373A2; JP-A Nos. 2001-247859, 2002-302671, 2002-117978, 2003-133074, 2002-235076, 2003-123982, and 2002-170684; European Patent (EP) No. 1211257; JP-A Nos. 2002-226495, 2002-234894, 2001-247859, 2001-298470, 2002-173674, 2002-203678, 2002-203679, 2004-357791, 2006-256999, 2007-19462, 2007-84635, 2007-96259, etc. Among these, more preferable examples of the light-emitting dopants include Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes; particularly preferable are Ir complexes, Pt complexes, and Re complexes; and among these, Ir complexes, Pt complexes, and Re complexes each containing at least one coordination mode of metal-carbon bonds, metal-nitrogen bonds, metal-oxygen bonds, and metal-sulfur bonds are preferred. Particularly preferably, Ir complexes, Pt complexes, and Re complexes each containing a tri- or higher-dentate ligand are preferred in view of light-emission efficiency, drive durability, color purity and the like.

<<Fluorescent Light-Emitting Dopant>>

Examples of the above-described fluorescent light-emitting dopants generally include benzoxazole, benzimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polycyclic aromatic compounds (anthracene, phenanthroline, pyrene, perylene, rubrene, pentacene and the like), a variety of metal complexes represented by metal complexes of 8-quinolinol, pyromethene complexes or rare-earth complexes, polymer compounds such as polythiophene, polyphenylene or polyphenylenevinylene, organic silanes, and derivatives thereof.

Among these, specific examples of the light-emitting dopants include the following compounds, but it should be noted that the present invention is not limited thereto.

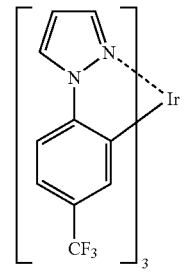

D-1

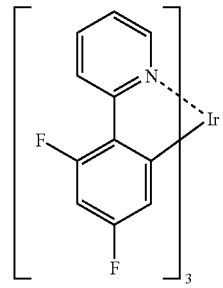

D-2

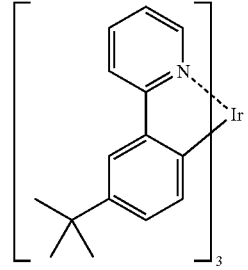

D-3

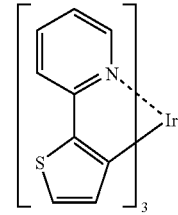

D-4

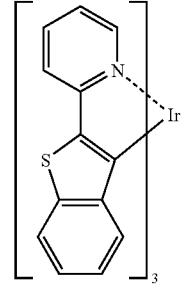

D-5

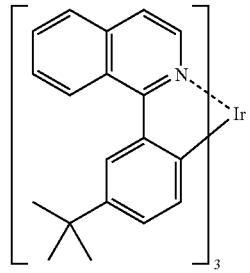

D-6

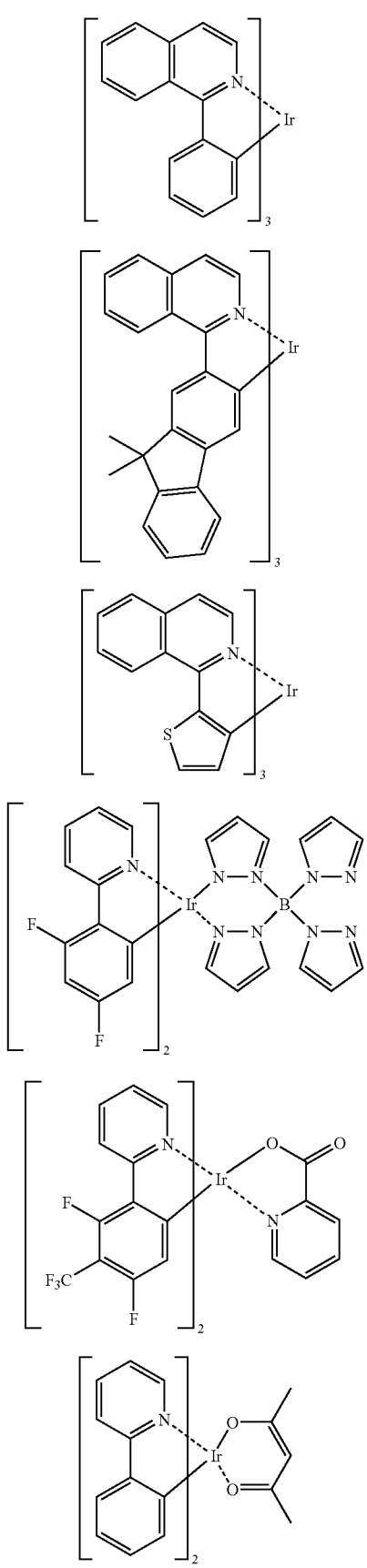
D-7
D-8
D-9
D-10
D-11
D-12
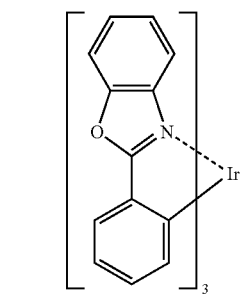
D-13
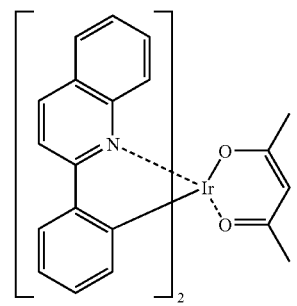
D-14
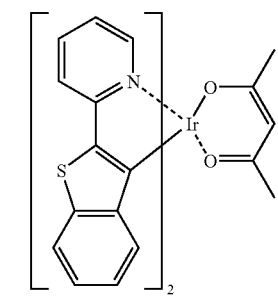
D-15
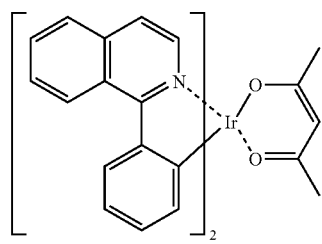
D-16
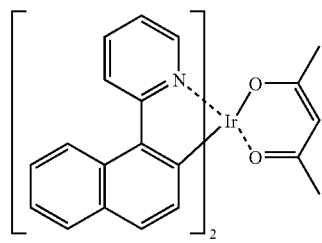
D-17

D-18
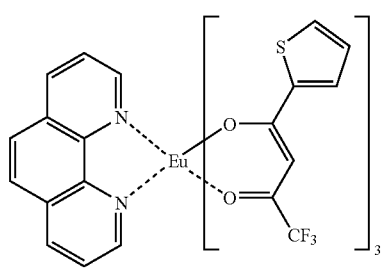
D-19
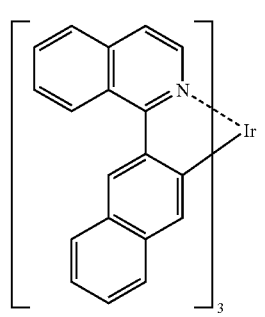
D-20
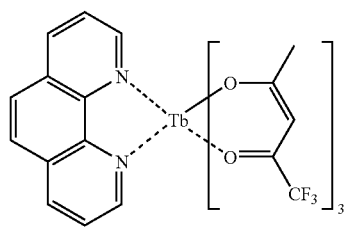
D-21
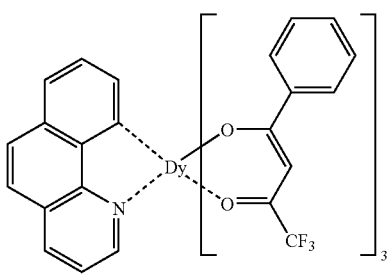
D-22
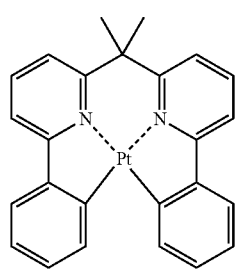
D-23
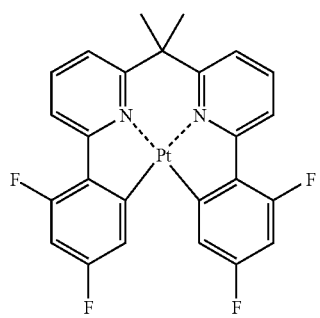
D-24
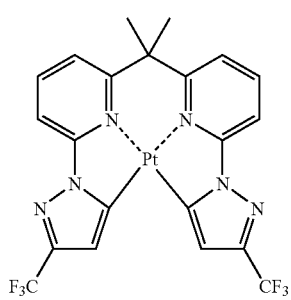
D-25
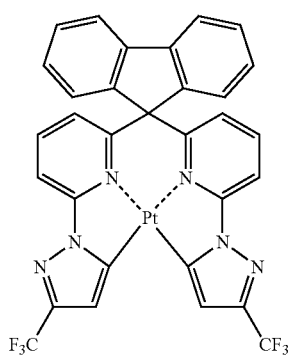
D-26
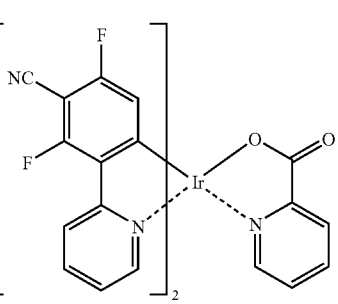
D-27
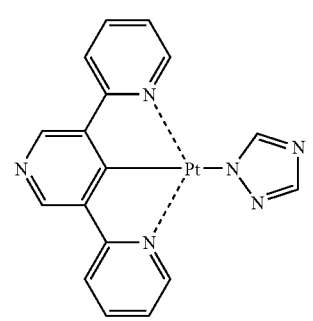

D-28
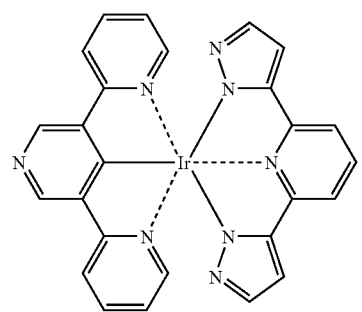
D-29
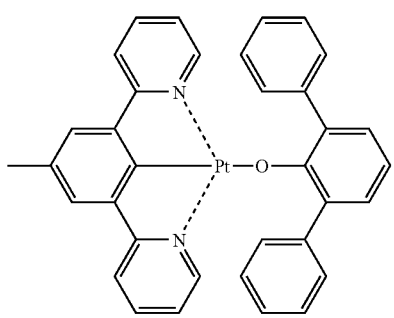
D-30
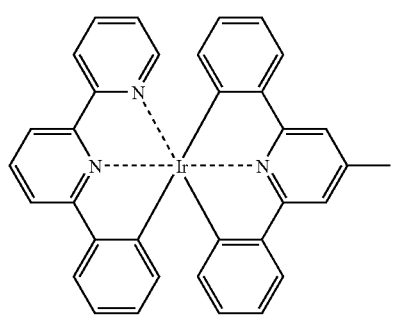
D-31
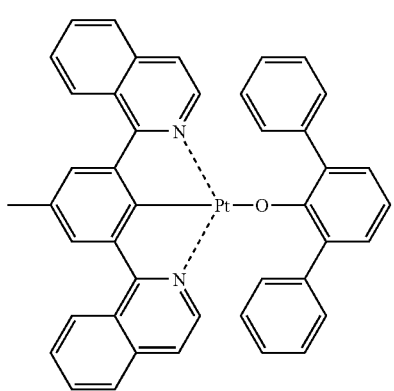
D-32
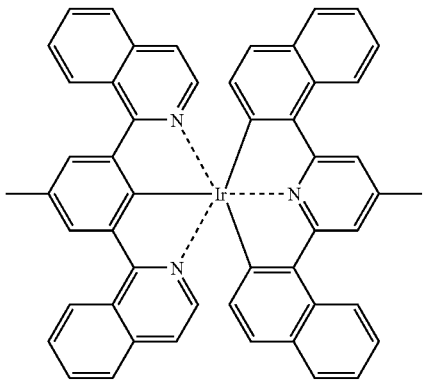
D-33
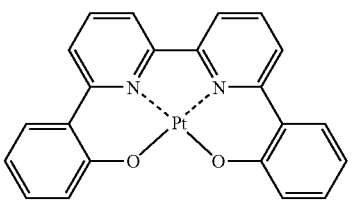
D-34
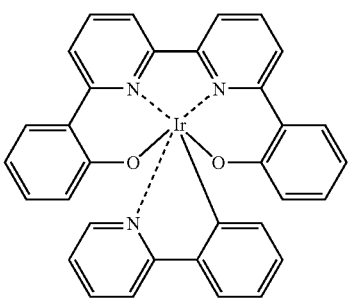
D-35
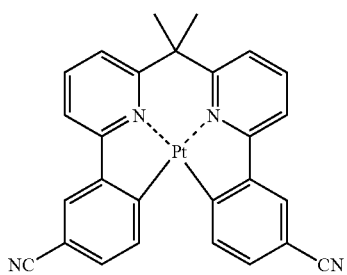
D-36
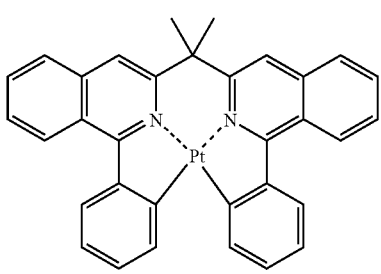

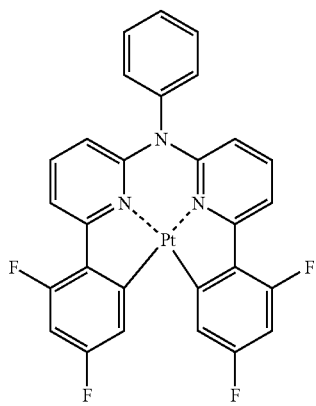
D-37

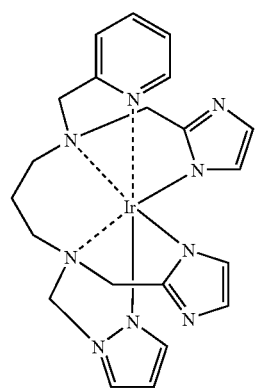
D-38

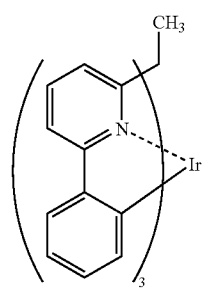
D-39

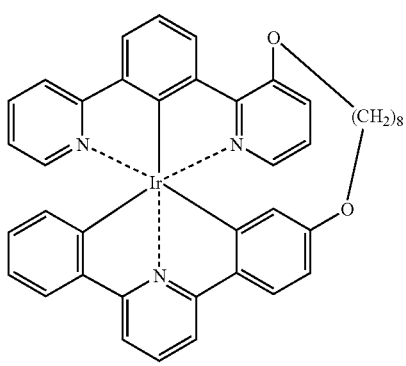
D-40

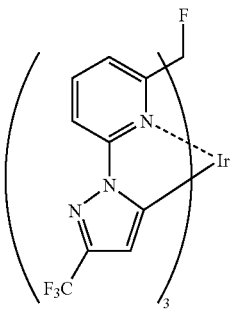
D-41

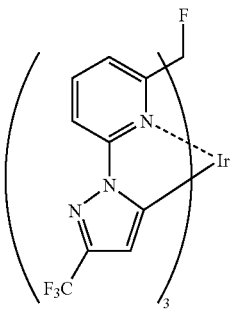
D-42

D-43

The light-emitting dopant in the light-emitting layer is contained in an amount of from 0.1% by weight to 50% by weight with respect to the total weight of the compounds generally forming the light-emitting layer, but it is preferably contained in an amount of from 1% by weight to 50% by weight, and more preferably in an amount of from 2% by weight to 40% by weight in view of drive durability and external quantum efficiency.

Although a thickness of the light-emitting layer is not particularly limited, 2 nm to 500 nm is usually preferred, and within this range, 3 nm to 200 nm is more preferable, and 5 nm to 100 nm is even more preferred in view of external quantum efficiency.

<Host Material>

As the host materials to be used in the present invention, hole transporting host materials excellent in hole transporting property (referred to as a "hole transporting host" in some cases) and electron transporting host compounds excellent in electron transporting property (referred to as an "electron transporting host" in some cases) may be used.

<<Hole Transporting Host>>

Specific examples of the hole transporting hosts used in the present invention include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electrically conductive high-molecular oligomers such as thiophene oligomers, polythiophenes and the like, organic silanes, carbon films, derivatives thereof, and the like.

Among these, indole derivatives, carbazole derivatives, aromatic tertiary amine compounds, and thiophene derivatives are preferable, and compounds containing a carbazole group in the molecule are more preferable. Particularly, compounds containing t-butyl substituted carbazole group are preferred.

<<Electron Transporting Host>>

As the electron transporting host included in the light-emitting layer in the present invention, it is preferred that an electron affinity Ea of the host is from 2.5 eV to 3.5 eV, more preferably from 2.6 eV to 3.4 eV, and even more preferably from 2.8 eV to 3.3 eV in view of improvements in durability and decrease in drive voltage. Furthermore, it is preferred that an ionization potential Ip of the host is 5.7 eV to 7.5 eV, more preferably 5.8 eV to 7.0 eV, and even more preferably 5.9 eV to 6.5 eV in view of improvements in drive durability and decrease in drive voltage.

Specific examples of such electron transporting hosts include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyrazine, fluorine-substituted aromatic compounds, aromacyclic tetracarboxylic anhydrides of naphthalene, perylene or the like, phthalocyanine, derivatives thereof (which may form a condensed ring with another ring), and a variety of metal complexes represented by metal complexes of 8-quinolinol derivatives, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like). Among these, metal complex compounds are preferred in the present invention in view of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and even more preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU— (Organometallic Chemistry—Fundamental and Application—)" authored by Akio Yamamoto, published by Shokabo Publishing Co., Ltd. in 1982, and the like.

The ligands are preferably nitrogen-containing heterocyclic ligands (having preferably 1 to 30 carbon atoms, more preferably 2 to 20 carbon atoms, and particularly preferably 3 to 15 carbon atoms); and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazinyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, 2-benzoxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting hosts include compounds described, for example, in JP-A Nos. 2002-235076, 2004-214179, 2004-221062, 2004-221065, 2004-221068, 2004-327313 and the like.

In the light-emitting layer according to the present invention, it is preferred that the lowest triplet excitation level (T1) of the host material is higher than T1 of the phosphorescent light-emitting material in view of color purity, light-emission efficiency, and drive durability.

Although a content of the host compounds according to the present invention is not particularly limited, it is preferably 15% by weight to 95% by weight with respect to the total weight of the compounds forming the light-emitting layer in view of light-emission efficiency and drive voltage.

(Hole Injection Layer and Hole Transport Layer)

The hole injection layer and hole transport layer correspond to layers functioning to receive holes from an anode or from an anode side and to transport the holes to a cathode side. Materials to be introduced into a hole injection layer or a hole transport layer is not particularly limited, but either of a low molecular compound or a high molecular compound may be used.

As a material for the hole injection layer and the hole transport layer, it is preferred to contain specifically pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organic silane derivatives, carbon, or the like.

An electron-accepting dopant may be introduced into the hole injection layer or the hole transport layer in the organic EL element according to the present invention. As the electron-accepting dopant to be introduced into the hole injection layer or the hole transport layer, either of an inorganic compound or an organic compound may be used as long as the compound has electron accepting property and a function for oxidizing an organic compound.

Specifically, the inorganic compound includes metal halides, such as iron (III) chloride, aluminum chloride, gallium chloride, indium chloride and antimony pentachloride and the like, and metal oxides, such as vanadium pentaoxide, molybdenum trioxide and the like.

In the case of applying the organic compounds, compounds having a substituent such as a nitro group, a halogen, a cyano group, a trifluoromethyl group or the like; quinone compounds; acid anhydride compounds; fullerenes; and the like may be preferably applied. Specific examples thereof other than those above include compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60 are preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferred, and tetrafluorotetracyanoquinodimethane is particularly preferred.

These electron-accepting dopants may be used alone or in a combination of two or more of them. Although an applied amount of these electron-accepting dopants depends on the type of material, 0.01% by weight to 50% by weight of a dopant is preferred with respect to a hole transport layer material, 0.05% by weight to 20% by weight is more preferable, and 0.1% by weight to 10% by weight is particularly preferred.

A thickness of the hole injection layer and the hole transport layer is preferably 500 nm or less in view of decrease in drive voltage.

A thickness of the hole transport layer is preferably from 1 nm to 500 nm, more preferably from 5 nm to 200 nm, and even more preferably from 10 nm to 100 nm. A thickness of the hole injection layer is preferably from 0.1 nm to 200 nm, more preferably from 0.5 nm to 100 nm, and even more preferably from 1 nm to 100 nm.

The hole injection layer and the hole transport layer may be composed of a monolayer structure comprising one or two or more of the above-mentioned materials, or a multilayer structure composed of plural layers of a homogeneous composition or a heterogeneous composition.

(Electron Injection Layer and Electron Transport Layer)

An electron injection layer and an electron transport layer are layers having any of functions for receiving electrons from a cathode or a cathode side, and transporting electrons to an anode side. An electron injection material or an electron transport material to be introduced therein may be either of a low molecular compound or a high molecular compound.

Specific examples of the materials include pyridine derivatives, quinoline derivatives, pyrimidine derivatives, pyrazine derivatives, phthalazine derivatives, phenanthoroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyradine derivatives, aromacyclic tetracarboxylic anhydrides of perylene or naphthalene, phthalocyanine derivatives, metal complexes represented by metal complexes of 8-quinolinol derivatives, metal phthalocyanine, and metal complexes containing benzoxazole or benzothiazole as the ligand, organic silane derivatives represented by silole, and the like.

The electron injection layer or the electron transport layer in the organic EL element according to the invention may contain an electron donating dopant. As the electron donating dopant introduced in the electron injection layer or the electron transport layer, any material may be used as long as it has an electron-donating property and a property for reducing an organic compound, and alkaline metals such as Li, alkaline earth metals such as Mg, transition metals including rare-earth metals, and reducing organic compounds are preferably used. As the metals, particularly, metals having a work function of 4.2 V or less are preferably applied, and specific examples thereof include Li, Na, K, Be, Mg, Ca, Sr, Ba, Y, Cs, La, Sm, Gd, Yb, and the like. Specific examples of the reducing organic compounds include nitrogen-containing compounds, sulfur-containing compounds, phosphorus-containing compounds, and the like.

In addition, materials described in JP-A Nos. 6-212153, 2000-196140, 2003-68468, 2003-229278 and 2004-342614 may be used.

These electron donating dopants may be used alone or in a combination of two or more of them. An applied amount of the electron donating dopants differs dependent on the types of the materials, but it is preferably from 0.1% by weight to 99% by weight with respect to an electron transport layer material, more preferably from 1.0% by weight to 80% by weight, and even more preferably from 2.0% by weight to 70% by weight.

A thickness of the electron injection layer and the electron transport layer is preferably 500 nm or less in view of decrease in drive voltage.

A thickness of the electron transport layer is preferably from 1 nm to 500 nm, more preferably from 5 nm to 200 nm, and even more preferably from 10 nm to 100 nm. A thickness of the electron injection layer is preferably 0.1 nm to 200 nm, more preferably 0.2 nm to 100 nm, and 0.5 nm to 50 nm is particularly preferred.

The electron injection layer and the electron transport layer may be composed of a monolayer structure comprising one or two or more of the above-mentioned materials, or a multilayer structure composed of plural layers of a homogeneous composition or a heterogeneous composition.

(Hole Blocking Layer)

A hole blocking layer is a layer having a function to prevent the holes transported from the anode side to the light-emitting layer from passing through to the cathode side. According to the present invention, a hole blocking layer may be provided as an organic compound layer adjacent to the light-emitting layer on the cathode side.

Examples of the compound constituting the hole blocking layer include an aluminum complex such as BAlq (aluminium (III) bis(2-methyl-8-quinolinato)-4-phenylphenolate), a triazole derivative, a phenanthroline derivative such as BCP (2,9-dimethyl-4,7-diphenyl-1,10-phenanthroline), or the like.

A thickness of the hole blocking layer is preferably from 1 nm to 500 nm, more preferably from 5 nm to 200 nm, and even more preferably from 10 nm to 100 nm.

The hole blocking layer may have either a monolayer structure comprising one or two or more of the above-mentioned materials, or a multilayer structure composed of plural layers of a homogeneous composition or a heterogeneous composition.

(Electron Blocking Layer)

An electron blocking layer is a layer having a function to prevent the electron transported from the cathode side to the light-emitting layer from passing through to the anode side. According to the present invention, an electron blocking layer may be provided as an organic compound layer adjacent to the light-emitting layer on the anode side. Specific examples of the compound constituting the electron blocking layer include compounds explained above as a hole-transporting material.

A thickness of the electron blocking layer is preferably from 1 nm to 500 nm, more preferably from 5 nm to 200 nm, and even more preferably from 10 nm to 100 nm.

The electron blocking layer may have either a monolayer structure comprising one or two or more of the above-mentioned materials, or a multilayer structure composed of plural layers of a homogeneous composition or a heterogeneous composition.

(Protective Layer)

According to the present invention, the whole organic EL element may be protected by a protective layer.

A material contained in the protective layer may be one having a function to prevent penetration of substances such as moisture and oxygen, which accelerate deterioration of the element, into the element.

Specific examples thereof include metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence element according to the present invention may be sealed with a sealing cap.

Furthermore, a moisture absorbent or an inert liquid may be used to seal a space defined between the sealing cap and the light-emitting element. Although the moisture absorbent is not particularly limited, specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

A sealing method by a resin sealing layer, which described below, is also preferably applied.

(Resin Sealing Layer)

A functional element according to the present invention is preferably prevented by the resin sealing layer from contact with the atmosphere to result in deterioration in performance of the element by oxygen or moisture.

<Material>

The resin material for the resin sealing layer is not particularly limited and an acrylic resin, an epoxy resin, a fluorocarbon resin, a silicone resin, a rubber resin, or an ester resins can be used. Among these, the epoxy resin is preferred in view of moisture preventive function. In the epoxy resin, a thermosetting epoxy resin, or a photo-curable epoxy resin is preferred.

<Manufacturing Method>

The manufacturing method of the resin sealing layer is not particularly limited and includes, for example, a method of coating a resin solution, a method of press bonding or hot press bonding a resin sheet or a method of dry polymerization by vapor deposition or sputtering, etc.

<Film Thickness>

The thickness of the resin sealing layer is preferably from 1 μm to 1 mm. It is more preferably from 5 μm to 100 μm, and most preferably from 10 μm to 50 μm. In the case where the thickness is smaller than 1 μm, the inorganic layer described above may possibly be damaged upon mounting of the second substrate. Further, in the case where the thickness is larger than 1 mm, the thickness of the electroluminescence element per se increases to damage the thin film property, which is a feature of the organic electroluminescence element.

(Sealing Adhesive)

The sealing adhesive used in the invention has a function of preventing intrusion of moisture or oxygen from the edge.

<Material>

As the material for the sealing adhesive, those identical with the materials used in the resin sealing layer can be used. Among all, an epoxy adhesive is preferred in view of preventing moisture, and among these, a photo-curable type adhesive or a thermosetting type adhesive is preferred.

Further, addition of filler to the materials described above is also preferred.

The filler added to the sealant is preferably inorganic materials such as $SiO_2$, SiO (silicon oxide), SiON (silicon oxynitride), or SiN (silicon nitride). The addition of the filler increases the viscosity of the sealant to improve producibility and improve humidity resistance.

<Drying Agent>

The sealing adhesive may also contain a drying agent. The drying agent is preferably barium oxide, calcium oxide, or strontium oxide.

The addition amount of the drying agent with respect to the sealing adhesive is preferably from 0.01% by weight to 20% by weight, and more preferably from 0.05% by weight to 15% by weight. The addition effect of the drying agent is reduced in the case where the amount is smaller than 0.01% by weight. Further, it is difficult to uniformly disperse the drying agent in the sealing adhesive in the case where the amount is larger than 20% by weight, which is not preferred.

<Formulation of Sealing Adhesive>

—Polymer Composition and Concentration—

The sealing adhesive is not particularly limited, and those described above can be used. For example, the photo-curable epoxy type adhesive includes XNR5516 manufactured by Nagase Chemtech Co. and the drying agent may be directly added to and dispersed therein.

—Thickness—

The coating thickness of the sealing adhesive is preferably from 1 μm to 1 mm. In the case where the thickness is smaller than 1 μm, the sealing adhesive can not be coated uniformly, which is not preferred. Further, in the case where the thickness is larger than 1 mm, moisture intrusion paths are increased, which is not preferred.

<Sealing Method>

In the invention, the sealing adhesive including the drying agent is coated in an optional amount by a dispenser or the like, a second substrate is stacked after coating, and they can be cured to obtain a functional element.

(Driving)

In the organic EL element according to the present invention, when DC (AC components may be contained as needed) voltage (usually 2 volts to 15 volts) or DC is applied across the anode and the cathode, light emission can be obtained.

For the driving method of the organic EL element according to the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

In the organic EL element according to the present invention, the light-extraction efficiency can be improved by various known methods. It is possible to improve light-extraction efficiency and to improve external quantum efficiency, for example, by modifying the surface shape of the substrate (for example by forming fine irregularity pattern), by controlling the refractive index of the substrate, the ITO layer and/or the organic layer, or by controlling the thickness of the substrate, the ITO layer and/or the organic layer.

The organic EL element according to the present invention may have a so-called top-emission configuration in which the light emission is extracted from the anode side.

The organic EL element according to the present invention may have a configuration of having an electric charge-generating layer provided between a plurality of the light-emitting layers for a purpose to enhance light emission efficiency.

The electric charge-generating layer has a function of generating electric charges (holes or electrons) during an application of an electric field as well as a function of injecting the generated electric charges into a layer adjacent to the electric charge-generating layer.

The electric charge-generating layer is formed by any material as long as it has the aforementioned functions, and may be formed by a single compound or a plurality of compounds.

Specific examples of the materials for the electric charge-generating layer include electrically conductive materials, semi-conductive materials such as doped organic compound layers, electric insulating materials, and materials described in JP-A Nos. 11-329748, 2003-272860 and 2004-39617.

More specific examples thereof include transparent electrically conductive materials such as indium tin oxide (ITO) and indium zinc oxide (IZO); fullerenes such as C60; electrically conductive organic substances such as thiophene oligomers; electrically conductive organic substances such as metal phthalocyanines, non-metal phthalocyanines, metal porphyrins and non-metal porphyrins; metal materials such as Ca, Ag, Al, Mg—Ag alloy, Al—Li alloy and Mg—Li alloy; hole conductive materials; electron conductive materials, and mixtures thereof.

Specific examples of the hole conductive material include hole transfer organic materials such as 2-TNATA or NPD doped with oxidants having electron attracting properties such as F4-TCNQ, TCNQ, or $FeCl_3$, P-type electrically conductive polymers, and P-type semiconductors. Specific examples of the electron conductive material include electron transport organic materials doped with metals or metal compounds having a work function of less than 4.0 eV, N-type electrically conductive polymers, and an N-type semiconductors. Specific examples of the N-type semiconductors include N-type Si, N-type CdS, N-type ZnS and the like. Specific examples of the P-type semiconductors include P-type Si, P-type CdTe, P-type CuO and the like.

Further, the electric charge-generating layer may use an electric insulating material such as $V_2O_5$.

The electric charge-generating layer can be formed by a single layer or a lamination of a plurality of layers. Specific examples of a structure of the lamination of a plurality of layers include a structure of a lamination of an electrically conductive material such as a transparent conductive material or a metal material and a hole conductive material or an electron conductive material, a structure of a lamination of the hole conductive material and the electron conductive material described above, and the like.

Preferably, a film thickness and a material in the electric charge-generating layer can be selected such that a transmittance of visible light becomes 50% or more. Further, the film thickness is not particularly limited; however, it is preferably from 0.5 nm to 200 nm, more preferably from 1 nm to 100 nm, further preferably from 3 nm to 50 nm, and particularly preferably from 5 nm to 30 nm.

A method of preparing the electric charge-generating layer is not particularly limited, and the above-described method of preparing organic compound layers can be used.

The electric charge-generating layer is formed between the two or more light-emitting layers. However, a material having a function of injecting an electric charge into layers adjacent thereto may be contained in a region of an anode side or cathode side of the electric charge-generating layer. In order to increase injection properties of electrons into layers adjacent at the anode side thereof, electron injection compounds such as BaO, SrO, $Li_2O$, LiCl, LiF, $MgF_2$, MgO, and $CaF_2$ may be laminated on the electric charge-generating layer at the anode side thereof.

Other than the materials according to the contents herein, materials for forming the electric charge-generating layer may be selected on the basis of the descriptions in JP-A No. 2003-45676, and U.S. Pat. Nos. 6,337,492, 6,107,734, and 6,872,472.

The organic EL element in the invention may have a resonator structure. For example, on a transparent substrate, a multi-layered film mirror comprising a plurality of stacked films of different reflective indexes, a transparent or semi-transparent electrode, a light-emitting layer, and a metal electrode are stacked to each other. The light generated in the light-emitting layer repeats reflection and conducts oscillation between the multi-layered film mirror and the metal electrode as reflection plates.

In another preferred embodiment of the resonator structure, on a transparent substrate, a transparent or semi-transparent electrode and a metal electrode function respectively as reflection plates in which light generated in the light-emitting layer repeats reflection and conducts oscillation therebetween.

For forming the resonance structure, an optical channel length determined based on the effective refractive index of two reflection plates, and the refractive index and the thickness for each of the layers between the reflection plates are controlled to optimal values for obtaining a desired resonance wavelength. A calculation formula in the case of the first embodiment is described in the specification of JP-A No. 9-180883, and the calculation formula in the case of the second embodiment is described in the specification of JP-A No. 2004-127795.

As a method for forming a full color-type organic EL display, there are known, for example, as described in *Monthly Display*, September 2000, pages 33 to 37, a tricolor light emission method which arranges organic EL elements emitting light corresponding to three primary colors (blue color (B), green color (G), and red color (R)) on a substrate respectively; a white color method which separates white light emitted by an organic EL element for white color emission into three primary colors through a color filter; and a color conversion method which converts a blue light emitted by an organic EL element for blue light emission into red color (R), and green color (G) through a fluorescent dye layer. Further, by combining a plurality of organic EL elements of different light emission colors obtained by the methods described above, planar type light sources of desired emission colors can be obtained. For example, they include a white color light source obtained by a combination of blue color and yellow color light emission elements, and a white color light source obtained by a combination of blue, green and red light emitting elements.

3. Protective Insulating Layer

In the organic EL display of the invention, the whole organic EL element is protected with a protective insulating layer. The protective insulating layer has a function to reduce damage to the organic EL element during production of TFT on the organic EL element, and a function to electrically insulate the organic EL element and the TFT. It is further preferred for the protective insulating layer to have a function to prevent penetration of substances which accelerate deterioration of the element, such as moisture, oxygen and the like, into the element.

Specific examples of materials for the protective insulating layer include metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective insulating layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

The upper electrode of the organic EL element and the source electrode or the drain electrode of the driving TFT are required to be electrically connected, and it is therefore necessary to form a contact hole in the protective insulating layer. A method of forming a contact hole includes a wet etching method using an etchant, a dry etching method using plasma and an etching method using laser.

4. Configuration of Pixel-Circuit in Organic EL Display

FIG. 5 is a schematic diagram of a pixel-circuit of an active matrix type organic EL display which uses the TFT of the invention. In FIG. 5, an organic EL element 300, a drive TFT 100, a switching TFT 200, and a capacitor 600 are wired with a scanning wire 500, signal wire 400, and common wire 700. The circuit of the display according to the invention is not particularly limited to that shown in FIG. 5. A circuit which is conventionally known in the art may be applied as-is.

(Applications)

The thin film field effect transistor of the invention can be used in an image display with a liquid crystal or EL element incorporated therein, and especially it can be used as a switching element or a driving element of an FPD. It is particularly suitable to use the thin film field effect transistor as a switching element or a driving element of a flexible FPD device. Further, a display incorporating the thin film field effect transistor of the invention has such wide ranging applications as a mobile phone display, a personal digital assistant (PDA), a computer display, a car information display, a TV monitor, and general illumination.

In addition to displays, the thin film field effect transistor of the invention can be applied extensively to e.g., IC cards, and ID tags, in which the thin film field effect transistor is formed on a flexible substrate such as an organic plastic film.

All publications, patent applications, and technical standards mentioned in this specification are herein incorporated by reference to the same extent as if each individual publication, patent application, or technical standard was specifically and individually indicated to be incorporated by reference.

Reference numerals used in Figures of the invention are explained below.

| | |
|---|---|
| 1: | Substrate |
| 2: | Gate electrode |
| 3: | Gate insulating layer |
| 4, 42, 44: | Active layer |
| 7, 72: | Low carrier concentration layer |
| 5-1: | Source electrode |
| 5-2: | Drain electrode |
| 6: | Insulating layer |
| 100: | Driving TFT |
| 200: | Switching TFT |
| 300: | Organic EL element |
| 400: | Signal wire |
| 500: | Scanning wire |
| 600: | Capacitor |
| 700: | Common wire |

Samples for measurement of physical properties were prepared under the same conditions as each of the Condition 1 to Condition 3 described above, in which a layer of 100 nm was provided directly on a non-alkali glass substrate (#1737, manufactured by Corning). The samples for measurement of physical properties were analyzed by a conventional X-ray diffraction method. As a result, it was verified that the resultant layers were amorphous layers. The carrier concentration and hole mobility of each sample for measurement of physical properties by means of a Hall effect measurement method described below, as well as the composition ratio thereof were measured. The obtained results are shown in Table 1.

—Measurement of Carrier Concentration by Hall Effect Measurement Method—

The carrier concentration of the sample for measurement of physical properties was determined by performing Hall effect measurement using a ResiTest 8300 (manufactured by Toyo Corporation). The Hall effect measurement was performed under an environment of 20° C. By the Hall effect measurement, not only the carrier concentration, but also the hole mobility of carrier can be determined. For measurement of film thickness of the sample for measurement of physical properties, a contact stylus-type surface profiler DekTak-6M (manufactured by ULVAC, Inc.) was used.

—Measurement Method of Composition Ratio—

The composition ratio of the sample for measurement of physical properties was determined by RBS (Rutherford backscattering) analysis.

TABLE 1

| | Oxide Material | Flow Rate of Oxygen (sccm) | Concetration of Electron Carrier ($cm^{-3}$) | Hole Mobility ($cm^2/Vs$) | Composition Ratio (molar ratio) |
|---|---|---|---|---|---|
| Condition 1 | IGZO | 1.7 | $1.6 \times 10^{15}$ | 7.6 | In:Ga:Zn = 1:0.95:0.63 |
| Condition 2 | IZO | 5.0 | $7.2 \times 10^{17}$ | 18 | In:Zn = 1:0.17 |
| Condition 3 | IZO | 3.0 | $6.0 \times 10^{19}$ | 42 | In:Zn = 1:0.17 |

EXAMPLES

In the following, the thin film field effect transistor of the present invention will be explained by examples thereof, but the invention is by no means limited by such examples.

Example 1

1. Preparation of Active Layer (Preparation of IGZO Semiconductor having Different Carrier Concentration)
<Condition 1>
Using a polycrystalline sintered body having a composition of $InGaZnO_4$ as a target, RF magnetron sputtering vacuum deposition was performed under the following conditions: flow rate of argon (Ar) of 96 sccm, flow rate of oxygen ($O_2$) of 1.7 sccm, RF power of 200 W, and total pressure of 0.4 Pa.
<Condition 2>
Using a sintered body having a composition of $In_2O_3$: 10% by weight of ZnO (manufactured by Idemitsu Kosan Co., Ltd.) as a target, RF magnetron sputtering vacuum deposition was performed under the following conditions: flow rate of Ar of 96 sccm, flow rate of $O_2$ of 5.0 sccm, RF power of 200 W, and total pressure of 0.4 Pa.
<Condition 3>
Deposition was performed under similar conditions to those in the Condition 2 except that the flow rate of $O_2$ was changed to 3.0 sccm.

The obtained results are shown in Table 1. It is shown that, in the sputtering layers of amorphous oxide semiconductors IGZO and IZO, the carrier concentration increases by reducing the flow rate of oxygen during sputtering, that is, by reducing the oxygen concentration in the sputtering layer.

2. Preparation of TFT Element

Using the above amorphous semiconductor materials, inventive TFT elements and comparative TFT elements were prepared. Concerning the cross-sectional constitution of these TFT elements, a reversed stagger structure shown in FIG. 1 was formed.

As the substrate, a non-alkali glass substrate ((#1737, manufactured by Corning) was used.
<Gate Electrode>
Using indium-zinc oxide having a ZnO content of 10% by weight (IZO, manufactured by Idemitsu Kosan Co., Ltd.) as a target, RF magnetron sputtering (conditions: temperature for film formation of 43° C., flow rate of sputtering gas Ar of 96 sccm, RF power of 200 W, and film-forming pressure of 0.4 Pa) was performed to form a thin IZO layer (with a thickness of 200 nm) as a gate electrode. Patterning of the IZO gate electrode was performed using a shadow mask during sputtering.
<Gate Insulating Layer>
Next, on the gate electrode, the following gate insulating layer was formed.

<<Condition 4>>

A gate insulating layer was provided by performing RF magnetron sputtering vacuum deposition of $SiO_2$ (conditions: target of $SiO_2$, temperature for film formation of 54° C., flow rates of sputtering gas $Ar/O_2$ of 12 sccm/2 sccm, RF power of 400 W, and film-forming pressure of 0.4 Pa) to form a layer having a thickness of 200 nm. Patterning of the $SiO_2$ gate insulating layer was performed using a shadow mask during sputtering.

<<Condition 5>>

$Y_2O_3$:$GeO_2$ was deposited under similar conditions to the Condition 4 except that the target was changed to $Y_2O_3$:$GeO_2$ (10% by weight).

<<Condition 6>>

$Y_2O_3$:$GeO_2$ was deposited under similar conditions to the Condition 4 except that the target was changed to $Y_2O_3$:$GeO_2$ (3% by weight).

<<Condition 7>>

$Y_2O_3$ was deposited under similar conditions to the Condition 4 except that the target was changed to $Y_2O_3$.

<Active Layer>

On the gate insulating layer, an active layer was provided using either of the conditions for preparing an active layer described above. The deposition thickness was adjusted by adjusting the time for sputtering. The conditions used and the deposition thickness are shown in Table 2. Patterning of the active layer was performed using a shadow mask during sputtering.

Then, on the above active layer, aluminum metal (Al) with a thickness of 360 nm was deposited as a source electrode and a drain electrode, by resistance heating deposition (temperature for film formation of 25° C.). Patterning of the source electrode and drain electrode was performed using a shadow mask during sputtering. Thereby, inventive TFT elements and comparative TFT elements each having a reversed stagger structure with a channel length (L) of 200 μm and a channel width (W) of 1000 μm were prepared.

<<Measurement of Thickness of Active Layer>>

After preparing the TFT element, a section of the TFT element was photographed by a conventional transmission electron microscope (TEM), and the thickness of the active layer was calculated from the obtained photograph.

<<Measurement of Mean Square Interface Roughness (Ra) Between Gate Insulating Layer and Active Layer>>

A section of the prepared TFT element was photographed by a conventional transmission electron microscope (TEM), and a mean square interface roughness between the gate insulating layer and the active layer was calculated in accordance with the following method.

A region of 1000 nm in a channel region is selected, and concerning the boundary line between the gate insulating layer and the active layer, trace boundary line data are gathered at the resolution of 0.1 nm or less. From the obtained boundary line data, low-frequency components of 20 nm or less are removed to prepare trend-removed data. A mean square error of the trend-removed data is determined and this is taken as a mean square interface roughness (Ra) between the gate insulating layer and the active layer.

3. Performance Evaluation

Each of the obtained TFT elements was stored for three months in a dark place at room temperature without putting a protective layer, and then, performance of the elements was evaluated.

For each of the TFT elements, TFT transfer characteristics at a drain voltage Vd in a saturation region of 10 V (gate voltage Vg: —10 V≦Vg≦15 V) was measured, and performance of the TFT was evaluated. The measurement of the TFT transfer characteristics was performed using a semiconductor parameter analyzer 4156C (manufactured by Agilent Technologies). Each parameter and its definition in the present invention are as follows.

Threshold voltage (Vth) of TFT: it is a gate voltage when the current value is 50 nA.

OFF current (Ioff): it is a drain current value when the gate voltage is lower by 5 V than the threshold voltage. The unit is [A].

ON current (Ion): it is a drain current value when the gate voltage is higher by 5 V than the threshold voltage. The unit is [A].

Shift quantity of threshold voltage (Vth $shift_1$): it is a quantity of variation in Vth when each TFT element is subjected to driving for five times continuously. The unit is [V].

Shift quantity of threshold voltage (Vth $shift_2$): during the measurement of the above TFT transfer characteristics, gate voltage Vg of 10 V and drain voltage Vd of 0 V (drain current of 0 A) are further applied for 1000 seconds to each TFT element as electric stress, and a quantity of variation in the threshold voltage of TFT between before and after the electric stress is determined and this is taken as Vth $shift_2$. The unit is [V].

The Vth $shift_1$ and Vth $shift_2$ show a degree of influence on driving hysteresis. The lower they are, the more preferable it is.

The TFT characteristics obtained by the measurement results are shown in Table 2.

From the results shown in Table 2, it is revealed that Examples 1 to 20, which have a mean square interface roughness between the gate insulating layer and the active layer of less than 2 nm, a carrier concentration of the active layer of $1 \times 10^{15}$ $cm^{-3}$ or more, and a thickness of the active layer of 0.5 nm or more and less than 20 nm, exhibit small Vth $shift_1$ (hysteresis), low Ioff, and large ON current, and show excellent performance suitable for driving an organic EL display element.

On the contrary, Comparative examples 8 to 11, in which the mean square interface roughness (Ra) between the gate insulating layer and the active layer is larger than that of the inventive TFT elements, exhibit large Vth $shift_1$ (hysteresis), or large Ioff, or low ON current, and are not suitable as a transistor for driving an organic EL display element.

In particular, Comparative examples 1, 3, 6, and 8, in which the active layer is thicker than the active layer of the inventive TFT elements, exhibit large hysterisis and are not suitable as a transistor for driving an organic EL display element.

In the case where the thickness of the active layer is 0.3 nm (not shown in Table 2), Ion is not detected, and the element does not operate as a transistor.

Concerning examples 6 to 9, 15 and 16, which have a mean square interface roughness (Ra) between the gate insulating layer and the active layer of 1 nm or less and a carrier concentration of the active layer of $1 \times 10^{17}$ $cm^{-3}$ or more, the ON current can become large even though the thickness of the active layer is less than 10 nm, and the TFT elements exhibit good hysteresis and smaller degree of deterioration in Ioff.

Particularly, concerning Example 9, which has a mean square interface roughness (Ra) between the gate insulating layer and the active layer of 0.5 nm or less and a carrier concentration of the active layer of $1 \times 10^{19}$ $cm^{-3}$ or more, even though the thickness of the active layer is less than 3 nm, the ON current can become large and the Vth $shift_2$ is more effective. Example 9 shows most excellent performance as a whole.

TABLE 2

| No. | Gate Insulating Layer Condition for Film Formation | Material | Layer Thickness (nm) | Mean Square Interface Roughness (nm) | Active Layer Condition (Active Layer) | Amorphous Oxide Semiconductor |
|---|---|---|---|---|---|---|
| Comparative Example 1 | Condition 4 | $SiO_2$ | 200 | | Condition 1 | IGZO |
| Example 1 | Condition 4 | $SiO_2$ | 200 | | Condition 1 | IGZO |
| Example 2 | Condition 4 | $SiO_2$ | 200 | | Condition 1 | IGZO |
| Example 3 | Condition 4 | $SiO_2$ | 200 | | Condition 1 | IGZO |
| Example 4 | Condition 4 | $SiO_2$ | 200 | | Condition 1 | IGZO |
| Comparative Example 2 | Condition 4 | $SiO_2$ | 200 | 0.4 | Condition 2 | IZO |
| Example 5 | Condition 4 | $SiO_2$ | 200 | 0.4 | Condition 2 | IZO |
| Example 6 | Condition 4 | $SiO_2$ | 200 | 0.4 | Condition 2 | IZO |
| Example 7 | Condition 4 | $SiO_2$ | 200 | 0.4 | Condition 2 | IZO |
| Example 8 | Condition 4 | $SiO_2$ | 200 | 0.4 | Condition 2 | IZO |
| Example 9 | Condition 4 | $SiO_2$ | 200 | 0.4 | Condition 3 | IZO |
| Comparative Example 3 | Condition 5 | $Y_2O_3:GeO_2$ (10 wt %) | 600 | 0.8 | Condition 1 | IGZO |
| Example 10 | Condition 5 | $Y_2O_3:GeO_2$ (10 wt %) | 600 | 0.8 | Condition 1 | IGZO |
| Example 11 | Condition 5 | $Y_2O_3:GeO_2$ (10 wt %) | 600 | 0.8 | Condition 1 | IGZO |
| Example 12 | Condition 5 | $Y_2O_3:GeO_2$ (10 wt %) | 600 | 0.8 | Condition 1 | IGZO |
| Example 13 | Condition 5 | $Y_2O_3:GeO_2$ (10 wt %) | 600 | 0.8 | Condition 1 | IGZO |
| Comparative Example 5 | Condition 5 | $Y_2O_3:GeO_2$ (10 wt %) | 600 | 0.8 | Condition 2 | IZO |
| Example 14 | Condition 5 | $Y_2O_3:GeO_2$ (10 wt %) | 600 | 0.8 | Condition 2 | IZO |
| Example 15 | Condition 5 | $Y_2O_3:GeO_2$ (10 wt %) | 600 | 0.8 | Condition 2 | IZO |
| Example 16 | Condition 5 | $Y_2O_3:GeO_2$ (10 wt %) | 600 | 0.8 | Condition 2 | IZO |
| Comparative Example 6 | Condition 6 | $Y_2O_3:GeO_2$ (3 wt %) | 600 | 1.5 | Condition 1 | IGZO |
| Example 17 | Condition 6 | $Y_2O_3:GeO_2$ (3 wt %) | 600 | 1.5 | Condition 1 | IGZO |
| Example 18 | Condition 6 | $Y_2O_3:GeO_2$ (3 wt %) | 600 | 1.5 | Condition 1 | IGZO |
| Comparative Example 7 | Condition 6 | $Y_2O_3:GeO_2$ (3 wt %) | 600 | 1.5 | Condition 2 | IZO |
| Example 19 | Condition 6 | $Y_2O_3:GeO_2$ (3 wt %) | 600 | 1.5 | Condition 2 | IZO |
| Example 20 | Condition 6 | $Y_2O_3:GeO_2$ (3 wt %) | 600 | 1.5 | Condition 2 | IZO |
| Comparative Example 8 | Condition 7 | $Y_2O_3$ | 600 | 3.0 | Condition 1 | IGZO |
| Comparative Example 9 | Condition 7 | $Y_2O_3$ | 600 | 3.0 | Condition 1 | IGZO |
| Comparative Example 10 | Condition 7 | $Y_2O_3$ | 600 | 3.0 | Condition 2 | IZO |
| Comparative Example 11 | Condition 7 | $Y_2O_3$ | 600 | 3.0 | Condition 2 | IZO |

| No. | Active Layer Carrier Concentration ($cm^{-3}$) | Active Layer Layer Thickness (nm) | $Vth\ Shift_1$ (V) | $Vth\ Shift_2$ (V) | Ioff (A) | Ion (A) |
|---|---|---|---|---|---|---|
| Comparative Example 1 | | | 7.0 | | | $1.3 \times 10^{-5}$ |
| Example 1 | | 14.0 | 4.1 | | $1.0 \times 10^{-12}$ | $2.2 \times 10^{-6}$ |
| Example 2 | $1.6 \times 10^{15}$ | 8.0 | 4.1 | | $6.0 \times 10^{-13}$ | $1.0 \times 10^{-6}$ |
| Example 3 | $1.6 \times 10^{15}$ | | 3.8 | | $3.0 \times 10^{-13}$ | $3.0 \times 10^{-7}$ |
| Example 4 | $1.6 \times 10^{15}$ | | 3.6 | | $2.0 \times 10^{-13}$ | $1.5 \times 10^{-7}$ |
| Comparative Example 2 | $7.2 \times 10^{17}$ | 25.0 | 1.3 | | $2.0 \times 10^{-10}$ | $2.0 \times 10^{-4}$ |
| Example 5 | $7.2 \times 10^{17}$ | 14.0 | 0.4 | | $6.0 \times 10^{-11}$ | $8.0 \times 10^{-5}$ |
| Example 6 | | 8.0 | 0.25 | | $2.3 \times 10^{-11}$ | $7.0 \times 10^{-5}$ |
| Example 7 | | 4.5 | 0.1 | | $3.0 \times 10^{-12}$ | $1.1 \times 10^{-5}$ |
| Example 8 | $7.2 \times 10^{17}$ | 2.5 | 0.05 | 1.00 | $1.0 \times 10^{-12}$ | $2.8 \times 10^{-6}$ |
| Example 9 | $6.0 \times 10^{19}$ | 2.5 | 0 | 0.10 | $1.2 \times 10^{-11}$ | $1.1 \times 10^{-5}$ |
| Comparative Example 3 | | 50 | 8.0 | | $9.0 \times 10^{-12}$ | $6.0 \times 10^{-6}$ |

TABLE 2-continued

| | | | | | |
|---|---|---|---|---|---|
| Example 10 | $1.6 \times 10^{15}$ | 14 | 5.0 | $3.0 \times 10^{-12}$ | $1.0 \times 10^{-6}$ |
| Example 11 | $1.6 \times 10^{15}$ | 8.0 | 5.0 | $2.0 \times 10^{-12}$ | $4.0 \times 10^{-7}$ |
| Example 12 | $1.6 \times 10^{15}$ | 4.5 | 4.5 | $1.0 \times 10^{-12}$ | $1.5 \times 10^{-7}$ |
| Example 13 | | | 2.5 | 4.0 | $5.0 \times 10^{-13}$ | $8.0 \times 10^{-8}$ |
| Comparative Example 5 | $7.2 \times 10^{17}$ | 25.0 | 1.5 | $5.0 \times 10^{-9}$ | $1.2 \times 10^{-4}$ |
| Example 14 | | 14.0 | 0.5 | $1.2 \times 10^{-9}$ | $5.0 \times 10^{-5}$ |
| Example 15 | | 8.0 | 0.35 | $3.0 \times 10^{-10}$ | $2.0 \times 10^{-5}$ |
| Example 16 | $7.2 \times 10^{17}$ | 4.5 | 0.13 | $5.0 \times 10^{-11}$ | $5.0 \times 10^{-6}$ |
| Comparative Example 6 | $1.6 \times 10^{15}$ | 50.0 | 10.0 | $3.0 \times 10^{-11}$ | $3.0 \times 10^{-6}$ |
| Example 17 | $1.6 \times 10^{15}$ | 14.0 | 7.0 | $8.0 \times 10^{-12}$ | $4.0 \times 10^{-7}$ |
| Example 18 | $1.6 \times 10^{15}$ | 8.0 | 5.0 | $5.0 \times 10^{-12}$ | $2.0 \times 10^{-7}$ |
| Comparative Example 7 | $7.2 \times 10^{17}$ | 25.0 | 2.3 | $2.0 \times 10^{-9}$ | $1.0 \times 10^{-4}$ |
| Example 19 | $7.2 \times 10^{17}$ | 14.0 | 0.9 | $3.0 \times 10^{-10}$ | $3.0 \times 10^{-5}$ |
| Example 20 | $7.2 \times 10^{17}$ | 8.0 | 0.45 | $1.0 \times 10^{-10}$ | $8.0 \times 10^{-6}$ |
| Comparative Example 8 | $1.6 \times 10^{15}$ | 50.0 | 12.0 | $2.0 \times 10^{-10}$ | $8.0 \times 10^{-7}$ |
| Comparative Example 9 | $1.6 \times 10^{15}$ | 14.0 | 8.0 | $6.0 \times 10^{-11}$ | $1.2 \times 10^{-7}$ |
| Comparative Example 10 | $7.2 \times 10^{17}$ | 25.0 | 3.0 | $1.3 \times 10^{-8}$ | $5.0 \times 10^{-5}$ |
| Comparative Example 11 | $7.2 \times 10^{17}$ | 14.0 | 1.2 | $3.0 \times 10^{-9}$ | $1.0 \times 10^{-5}$ |

Example 2

A TFT element was prepared in a similar manner to that in Example 1, except that a barrier-attached film including an insulating layer having a function for barrier described below on both sides of a polyethylene naphthalate film (having a thickness of 100 μm) was used instead of the non-alkali glass substrate in Example 1.

Insulating layer: SiON was deposited to give a thickness of 500 nm. For the deposition of SiON, an RF magnetron sputtering deposition method (conditions for sputtering: target of $Si_3N_4$, RF power of 400 W, flow rates of gas $Ar/O_2$ of 12 sccm/3 sccm, and film-forming pressure of 0.45 Pa) was applied.

The obtained element was evaluated in a similar manner to that in Example 1. As a result, the element exhibited unexpectedly extremely low hysteresis and low OFF current, and showed excellent performance suitable for driving an organic EL display, similar to the results in Example 1.

Example 3

1. Preparation of Organic EL Display (Preparation of Organic EL Element Part)

1) Formation of Lower Electrode

As a substrate, a barrier-attached film including an insulating layer having a function for barrier described below on both sides of a polyethylene naphthalate film was used.

Insulating layer: SiON was deposited to give a thickness of 500 nm. For the deposition of SiON, an RF magnetron sputtering deposition method (conditions for sputtering: target of $Si_3N_4$, RF power of 400 W, flow rates of gas $Ar/O_2$ of 12 sccm/3 sccm, and film-forming pressure of 0.45 Pa) was applied.

On the above substrate, indium-tin oxide (which is referred to hereinafter as ITO) was deposited at a thickness of 150 nm to form an anode.

2) Formation of Organic Layer

After cleaning, a hole injection layer, a hole transport layer, a light-emitting layer, a hole blocking layer, an electron transport layer and an electron injection layer were disposed in this order.

The composition of each layer is as follows. Each layer was provided by resistance heating vacuum deposition.

Hole injection layer: a layer containing 4,4',4"-tris(2-naphthylphenylamino)triphenylamine (which is referred to as 2-TNATA) and 2,3,5,6-tetrafluoro-7,7,8,8-tetracyanoquinodimethane (which is referred to as F4-TCNQ), wherein an amount of F4-TCNQ was 1% by weight with respect to 2-TNATA; at a thickness of 160 nm.

Hole transport layer: N,N'-dinaphthyl-N,N'-diphenyl-[1,1'-biphenyl]-4,4'-diamine (which is referred to as α-NPD); at a thickness of 10 nm.

Light-emitting layer: a layer containing 1,3-bis(carbazol-9-yl)benzene (which is referred to as mCP) and platinum complex Pt-1, wherein an amount of Pt-1 was 13% by weight with respect to mCP; at a thickness of 60 nm.

Hole blocking layer: aluminium (III) bis(2-methyl-8-quinolinato)-4-phenylphenolate (which is referred to hereinafter as BAlq); at a thickness of 40 nm.

Electron transport layer: tris(8-hydroxyquinolinato)aluminum (which is referred to hereinafter as Alq3); at a thickness of 10 nm.

Electron injection layer: lithium fluoride (LiF); at a thickness of 1 nm.

3) Formation of Upper Electrode

Patterning was performed using a shadow mask so that the size of the element would become 2 mm×2 mm, and aluminum metal (Al) was deposited at a thickness of 100 nm to form a cathode.

(Protective Insulating Layer)

On the upper electrode, as a protective insulating layer, a SiON layer with a thickness of 500 nm was formed by an ion plating method. After forming the layer, a contact hole was formed by a laser beam.

Chemical structures of the compounds used in Examples are shown below.

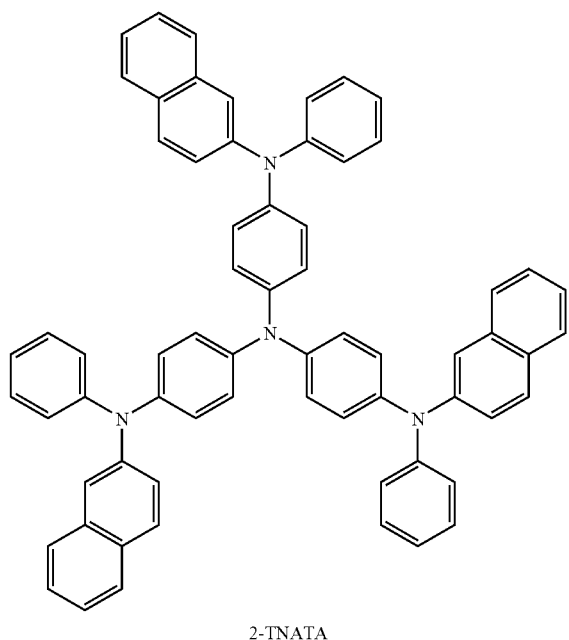

2-TNATA

F4-TCNQ

α-NPD mCP

-continued

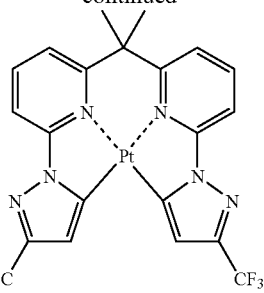

Pt-1

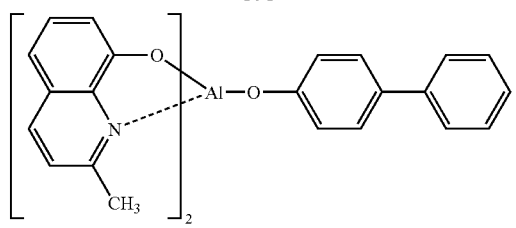

BAlq

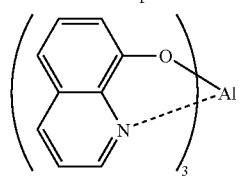

Alq₃

(Driving Test)

The obtained organic EL element and the TFT element prepared in EXAMPLE 1 were used in combination to constitute an equivalent circuit, and driving tests were performed under various conditions.

As a result, by using the TFT of the invention, stable light emission was obtained even when the TFT was driven at a high temperature and even when the TFT was driven continuously for a long time.

What is claimed is:

1. A thin film field effect transistor comprising:
    on an insulating substrate, at least a gate electrode, a gate insulating layer, an active layer containing an amorphous oxide semiconductor, a source electrode, and a drain electrode,
    wherein a mean square interface roughness between the gate insulating layer and the active layer is less than 2 nm, a carrier concentration of the active layer is $1 \times 10^{15}$ cm$^{-3}$ or more, and a film thickness of the active layer is 0.5 nm or more and less than 10 nm; and
    a low carrier concentration layer that is in contact with the active layer on the opposite side of the active layer from the gate insulating layer and from the substrate, that has a carrier concentration of $10^{16}$ cm$^{-3}$ or less, and that contains an amorphous oxide semiconductor.

2. The thin film field effect transistor according to claim 1, wherein the mean square interface roughness between the gate insulating layer and the active layer is less than 1 nm.

3. The thin film field effect transistor according to claim 1, wherein the mean square interface roughness between the gate insulating layer and the active layer is less than 0.5 nm, and the film thickness of the active layer is 0.5 nm or more and less than 5 nm.

4. The thin film field effect transistor according to claim 1, wherein the amorphous oxide semiconductor of the active layer contains at least one selected from the group consisting of In, Ga, Zn and Sn.

5. The thin film field effect transistor according to claim 1, wherein the amorphous oxide semiconductor of the low carrier concentration layer contains at least one selected from the group consisting of In, Ga, Zn and Sn.

6. The thin film field effect transistor according to claim 5, wherein the amorphous oxide semiconductor of the low carrier concentration layer contains at least one of In or Ga.

7. The thin film field effect transistor according to claim 1, wherein the gate insulating layer contains an amorphous oxide containing at least one element selected from the group consisting of Si, Hf, Y and Ge.

8. The thin film field effect transistor according to claim 1, wherein the insulating substrate is a flexible resin substrate.

9. The thin film field effect transistor according to claim 1, wherein the amorphous oxide semiconductor of the active layer contains at least one selected from the group consisting of In, Ga, Zn and Sn, and the amorphous oxide semiconductor of the low carrier concentration layer contains at least one selected from the group consisting of In, Ga, Zn and Sn.

10. The thin film field effect transistor according to claim 9, wherein the amorphous oxide semiconductor of the active layer and the amorphous oxide semiconductor of the low carrier concentration layer have compositions that are different from each other.

11. The thin film field effect transistor according to claim 1, wherein the gate insulating layer comprises an insulator selected from $SiO_2$, $SiN_x$, SiON, $Ta_2O_5$, or a mixed crystal compound containing at least two selected from $SiO_2$, $SiN_x$, SiON or $Ta_2O_5$.

12. The thin film field effect transistor according to claim 11, wherein a thickness of the gate insulating layer is from 10 nm to 10 µm.

13. The thin film field effect transistor according to claim 1, wherein the gate insulating layer comprises $SiO_2$.

14. The thin film field effect transistor according to claim 13, wherein a thickness of the gate insulating layer is from 10 nm to 10 µm.

15. A display using the thin film field effect transistor according to claim 1.

* * * * *